United States Patent [19]

Yoshida et al.

[11] Patent Number: 5,254,990
[45] Date of Patent: Oct. 19, 1993

[54] METHOD AND APPARATUS FOR COMPRESSION AND DECOMPRESSION OF DATA

[75] Inventors: Shigeru Yoshida, Ebina; Yasuhiko Nakano, Atsugi; Yoshiyuki Okada, Isehara; Hirotaka Chiba, Atsugi, all of Japan

[73] Assignee: Fujitsu Limited, Kanagawa, Japan

[21] Appl. No.: 3,876

[22] Filed: Jan. 11, 1993

Related U.S. Application Data

[63] Continuation of Ser. No. 768,201, Oct. 24, 1991, abandoned.

[30] Foreign Application Priority Data

| Feb. 26, 1990 [JP] | Japan | 2-45163 |
| Mar. 13, 1990 [JP] | Japan | 2-62325 |
| Mar. 20, 1990 [JP] | Japan | 2-070379 |
| Oct. 15, 1990 [JP] | Japan | 2-275835 |

[51] Int. Cl.$^5$ ............................................. H03M 7/30
[52] U.S. Cl. ..................................... 341/51; 341/87
[58] Field of Search .................... 341/51, 65, 67, 87

[56] References Cited

U.S. PATENT DOCUMENTS

| 4,494,108 | 1/1985 | Langdon, Jr. et al. | 341/51 |
| 4,558,302 | 12/1985 | Welch | 341/51 |
| 4,876,541 | 10/1989 | Storer | 341/51 |
| 4,881,075 | 11/1989 | Weng | 341/87 |
| 4,899,148 | 2/1990 | Sato et al. | 341/65 |
| 5,027,376 | 6/1991 | Friedman et al. | 375/122 |

OTHER PUBLICATIONS

*BIT*, vol. 25, No. 4, 1985, pp. 593–603; Jakobsson, M. "Compression of Character Strings by an Adaptive Dictionary".
European Search Report dated Oct. 30, 1992.

*Primary Examiner*—Marc S. Hoff
*Attorney, Agent, or Firm*—Armstrong, Westerman, Hattori, McLeland & Naughton

[57] ABSTRACT

In a data compressing and decompressing apparatus, having improved efficiency and enhanced compression ratio whereby character sequence of received data is coded and decoded by referring to a dictionary related to the last character of the immediately preceding character sequence, and a character sequence which is one character extended character sequence of the coded and decompressed character sequence is registered in the dictionary in relation with the last character of the immediately preceding character sequence so that the compression ratio of the coding of data is increased.

19 Claims, 41 Drawing Sheets

Fig.13

REGISTRATION OF ADDITIONAL CODE

| CHARACTER SEQUENCE | a | b | a | b | c | b | a | b | a | b | a | a | a | a | a | a |
|---|---|---|---|---|---|---|---|---|---|---|---|---|---|---|---|---|
| CODE | a/1 | b/2 | a b / 4 | | c/3 | b/5 | a b / 8 | | a b / 1 | | a/10 | | a a / 11 | | a/1 | |
| ADDITIONAL CODE TO STORAGE | a b / 4 | | b a / 5 | b c / 6 | | c b / 7 | b a b / 8 | | b a b / 9 | | a a / 10 | a a / 11 | | a a a / 12 | | |

Fig.14

| PARTIAL SEQUENCE | CODE | DATA TO BE REGISTERED IN STORAGE |
|---|---|---|
| a | 1 | a |
| b | 2 | b |
| c | 3 | c |
| a b | 4 | 1 b |
| b a | 5 | 2 a |
| a b c | 6 | 4 c |
| c b | 7 | 3 b |
| b a b | 8 | 5 b |
| b a b a | 9 | 8 a |
| a a | 10 | 1 a |
| a a a | 11 | 10 a |
| a a a a | 12 | 11 a |

Fig.15

DECODING OPERATION

| CODE | DECODING | | | DECODED OUTPUT | DATA TO BE REGISTERED IN STORAGE |
|---|---|---|---|---|---|
| | FIRST STEP | SECOND STEP | THIRD STEP | | |
| 1 | a | | | a | $\underbrace{a,b}$ → 4 |
| 2 | b | | | b | $\underbrace{b,a}$ → 5 |
| 4 | 1b | 1→a | | ab | $\underbrace{ab,c}$ → 6 |
| 3 | c | | | c | $\underbrace{c,b}$ → 7 |
| 5 | 2a | 2→b | | ba | $\underbrace{ba,b}$ → 8 |
| 8 | 5b | 5→2a | 2→b | bab | $\underbrace{bab,a}$ → 9 |
| 1 | a | | | a | $\underbrace{a,a}$ → 10 |
| 10 | 1a | 1→a | | aa | $\underbrace{aa,a}$ → 11 |
| 11 | 10a | 10→1a | 1→a | aaa | |

Fig.18
FORM OF CODE WORD
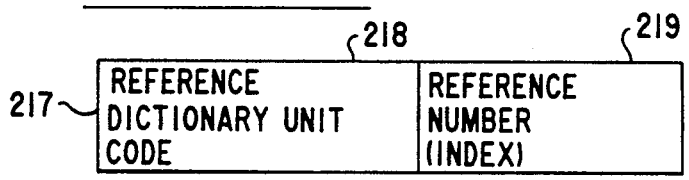
EXAMPLE OF OPTIMAL CODE CONVERSION
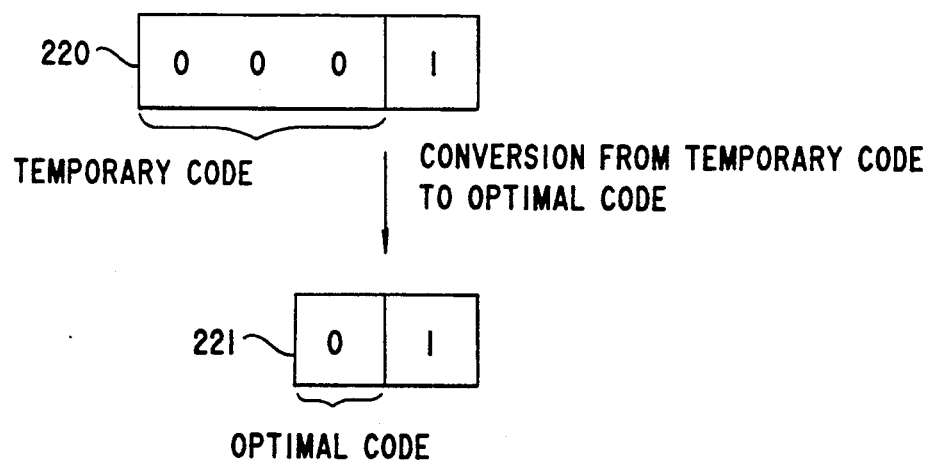

Fig. 20

ZL SYSTEM CODING OF INCREMENTAL PARSING TYPE a a b a b a b a a b a ...... RECEIVED CHARACTER SEQUENCE
X₁ X₂ X₃ X₄ X₅ X₆

$X_1 = a$, $X_2 = X_1 b$, $X_3 = X_2 a$, $X_4 = b$, $X_5 = X_1 a$, $X_6 = X_4 a$

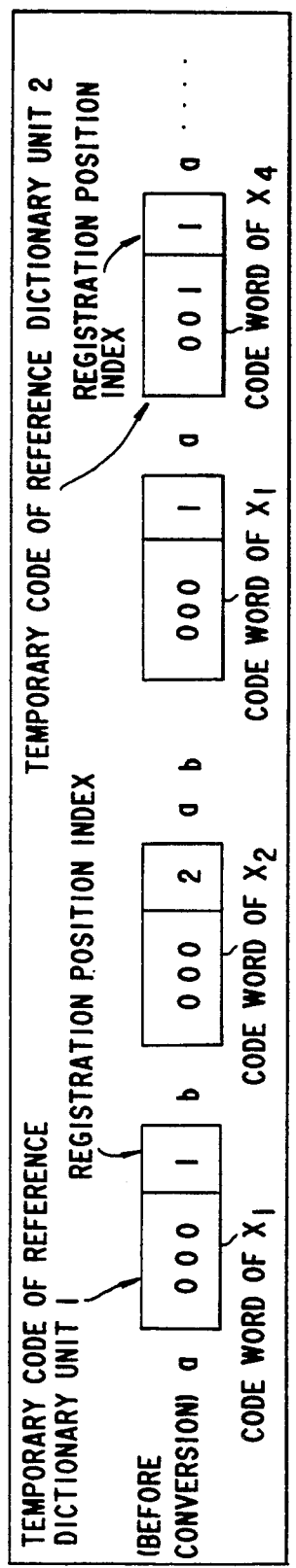

COMPRESSED CODE USING TEMPORARY CODE

TEMPORARY CODE OF REFERENCE DICTIONARY UNIT 1 / TEMPORARY CODE OF REFERENCE DICTIONARY UNIT 2

(BEFORE CONVERSION)

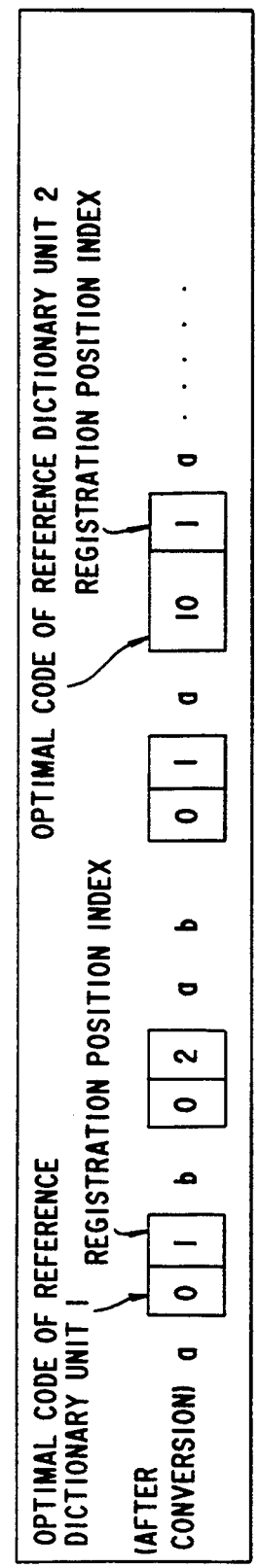

COMPRESSED CODE AFTER CONVERTED INTO OPTIMAL CODE

OPTIMAL CODE OF REFERENCE DICTIONARY UNIT 1 / OPTIMAL CODE OF REFERENCE DICTIONARY UNIT 2

(AFTER CONVERSION)

Fig.22

GROUP NUMBER OF BEGINNING CHARACTER OF CURRENT REGISTERED CHARACTER

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 0 | 0 | 1 | 9 | 4 | 8 | 14 | 10 | 6 | 2 | 11 | 15 | 13 | 5 | 12 | 7 | 3 |
| 1 | 0 | 5 | 4 | 1 | 12 | 15 | 7 | 2 | 8 | 6 | 14 | 11 | 10 | 13 | 9 | 3 |
| 2 | 2 | 4 | 6 | 0 | 3 | 12 | 1 | 7 | 9 | 13 | 11 | 15 | 10 | 14 | 8 | 5 |
| 3 | 2 | 0 | 5 | 7 | 10 | 15 | 4 | 1 | 12 | 9 | 14 | 11 | 8 | 13 | 6 | 3 |
| 4 | 2 | 12 | 5 | 11 | 4 | 9 | 1 | 7 | 3 | 13 | 14 | 15 | 0 | 10 | 8 | 6 |
| 5 | 5 | 9 | 4 | 11 | 2 | 7 | 6 | 1 | 8 | 3 | 10 | 15 | 12 | 13 | 14 | 0 |
| 6 | 6 | 10 | 2 | 1 | 4 | 11 | 9 | 5 | 8 | 12 | 14 | 15 | 0 | 13 | 3 | 7 |
| 7 | 3 | 4 | 8 | 12 | 9 | 15 | 6 | 0 | 7 | 12 | 14 | 15 | 5 | 13 | 2 | 0 |
| 8 | 0 | 9 | 13 | 7 | 7 | 15 | 10 | 4 | 6 | 5 | 11 | 11 | 1 | 8 | 3 | 2 |
| 9 | 2 | 0 | 9 | 7 | 12 | 5 | 10 | 8 | 5 | 13 | 10 | 13 | 6 | 4 | 14 | 1 |
| A | 2 | 3 | 0 | 7 | 4 | 9 | 6 | 15 | 8 | 9 | 14 | 13 | 12 | 13 | 14 | 1 |
| B | 2 | 4 | 12 | 15 | 8 | 13 | 14 | 15 | 6 | 3 | 11 | 11 | 8 | 9 | 5 | 0 |
| C | 1 | 11 | 9 | 5 | 5 | 11 | 4 | 6 | 0 | 10 | 10 | 13 | 4 | 13 | 2 | 3 |
| D | 5 | 3 | 8 | 4 | 12 | 14 | 14 | 7 | 1 | 2 | 11 | 6 | 0 | 9 | 8 | 0 |
| E | 3 | 7 | 13 | 15 | 9 | 15 | 6 | 4 | 2 | 12 | 14 | 15 | 3 | 10 | 13 | 3 |
| F | 0 | 6 | 13 | 4 | 12 | 14 | 11 | 2 | 5 | 8 | 14 | 10 | 3 | 9 | 1 | 7 |

| 0 | 1 | 2 | 3 | 4 | 5 | 6 | 7 | 8 | 9 | A | B | C | D | E | F |

GROUP NUMBER OF LAST CHARACTER OF PRECEDING REGISTERED CHARACTER

| FREQUENCY | CODE |
|---|---|
| 0 | 0 0 |
| 1 | 0 1 |
| 2 | 1 0 0 |
| 3 | 1 0 1 |
| 4 | 1 1 0 |
| 5 | 1 1 1 0 0 0 0 |
| 6 | 1 1 1 0 0 0 1 |
| 7 | 1 1 1 0 0 1 0 |
| 8 | 1 1 1 0 0 1 1 |
| 9 | 1 1 1 0 1 0 0 |
| 10 | 1 1 1 0 1 0 1 |
| 11 | 1 1 1 0 1 1 0 |
| 12 | 1 1 1 0 1 1 1 |
| 13 | 1 1 1 1 0 0 0 |
| 14 | 1 1 1 1 0 0 1 |
| 15 | 1 1 1 1 0 1 0 |

OPTIMAL CODE IS 1110101

| CODE WORD OF OPTIMAL CODE | TEMPORARY CODE | INDEX | ⇒ | OPTIMAL CODE 1110101 | INDEX |

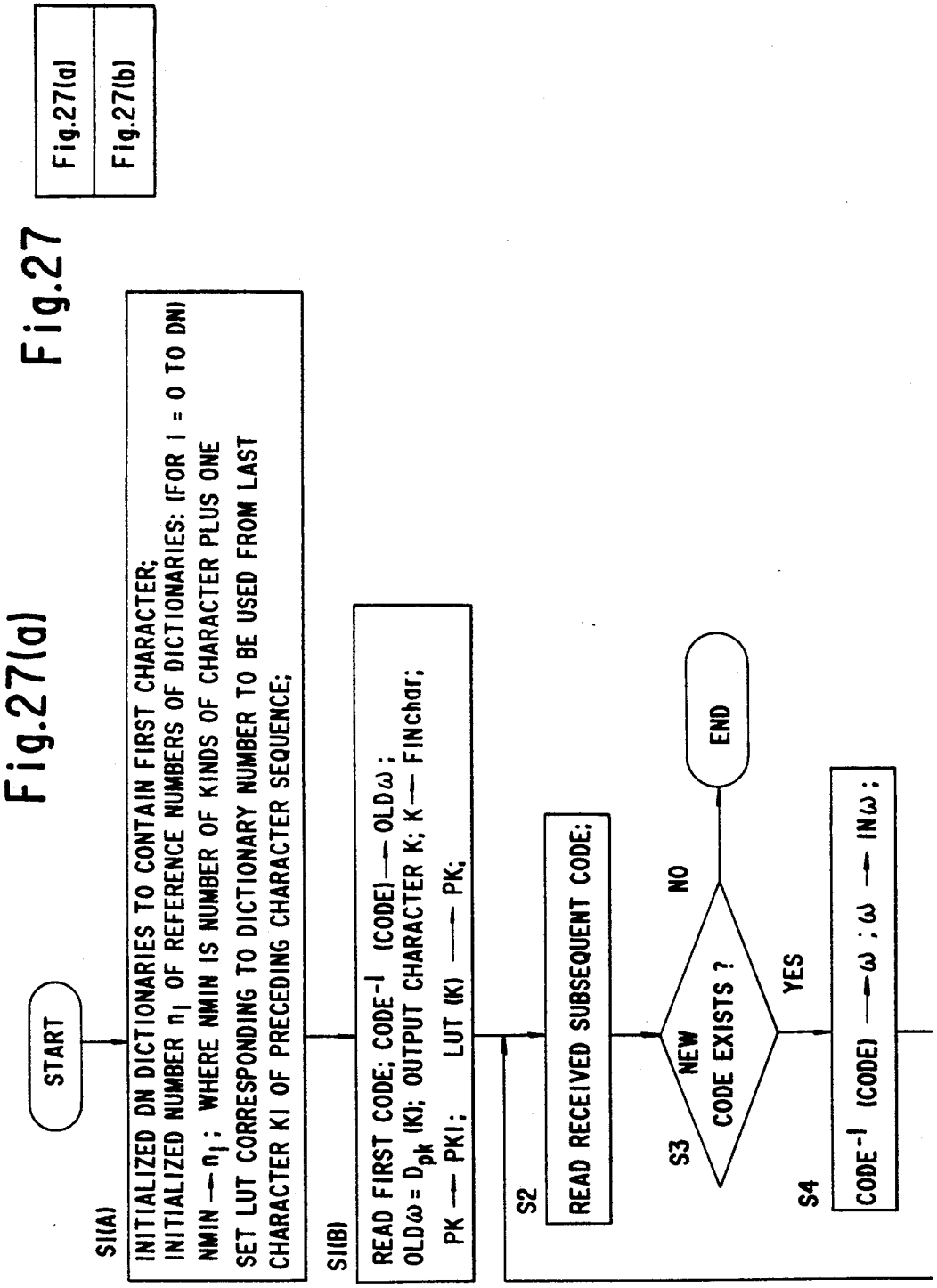

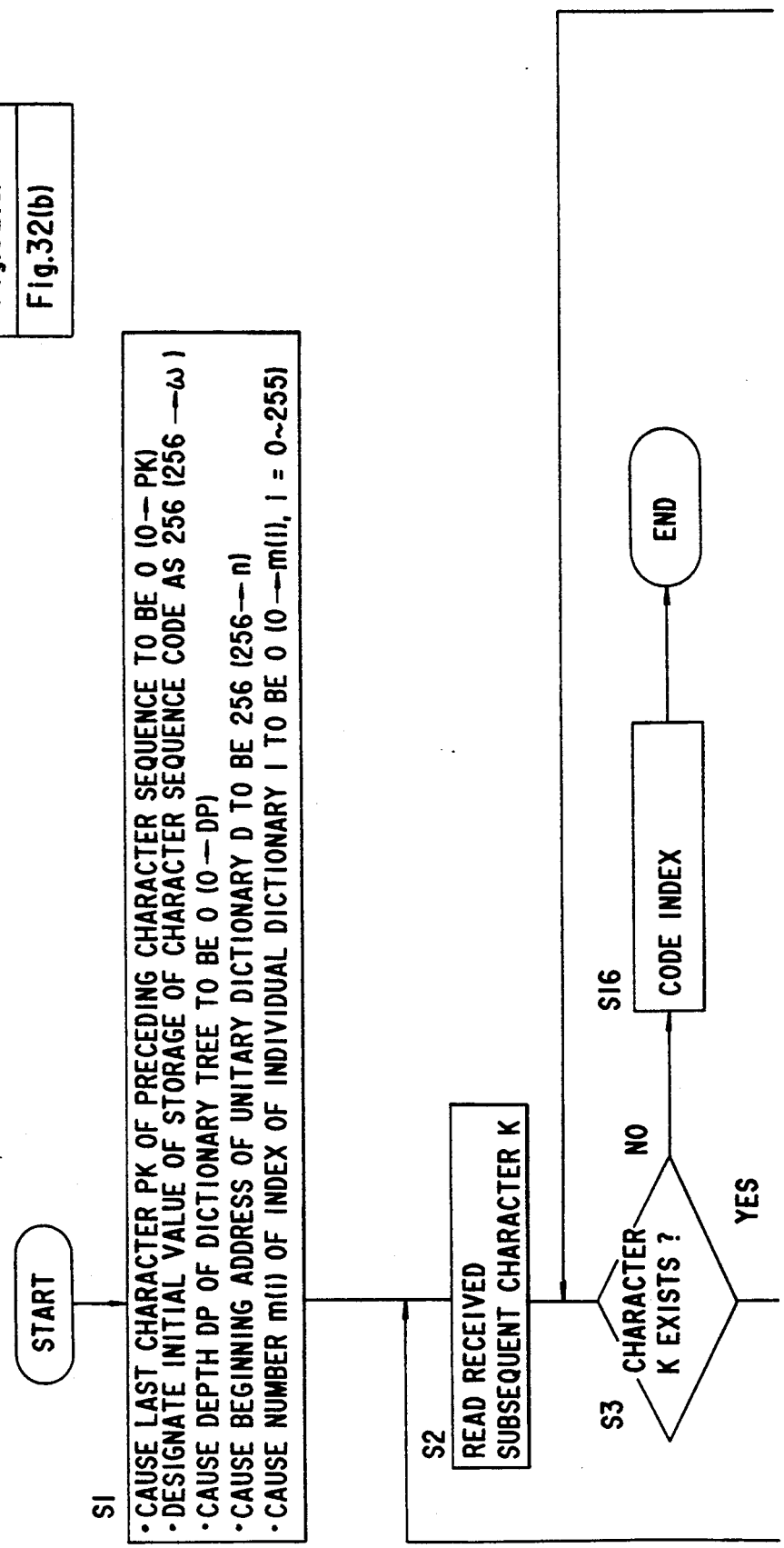

Fig.33

(UNITARY DICTIONARY IN CODING OF CHARACTER SEQUENCE "ababcbabaa...")

| n | D(n) | | |
|---|---|---|---|
| 1 | | a | (INITIAL CONDITION) |
| 2 | | b | (INITIAL CONDITION) |
| 3 | | c | (INITIAL CONDITION) |
| 4 | 0 | a | (0 IS INITIAL VALUE OF $\omega$) |
| 5 | 1 | b | (a b) |
| 6 | 2 | a | (b a) |
| 7 | 5 | c | (a b c) |
| 8 | 2 | c | (b c) |
| 9 | 3 | b | (c b) |
| 10 | 6 | b | (b a b) |
| 11 | 5 | a | (a b a) |
| 12 | 10 | a | (b a b a) |
| 13 | 6 | a | (b a a) |
| ⋮ | ⋮ | | |

Fig.34

(INDIVIDUAL DICTIONARY IN CODING OF CHARACTER SEQUENCE "ababcbabaa...")

| | n | l(n) |
|---|---|---|
| INDIVIDUAL DICTIONARY 0 | 4 | 1 |

| | n | l(n) |
|---|---|---|
| INDIVIDUAL DICTIONARY a | 5 | 1 |
| | 7 | 2 |
| | 11 | 3 |
| | ⋮ | ⋮ |

| | n | l(n) |
|---|---|---|
| INDIVIDUAL DICTIONARY b | 6 | 1 |
| | 8 | 2 |
| | 10 | 3 |
| | 12 | 4 |
| | 13 | 5 |
| | ⋮ | ⋮ |

| | n | l(n) |
|---|---|---|
| INDIVIDUAL DICTIONARY c | 9 | 1 |
| | ⋮ | ⋮ |

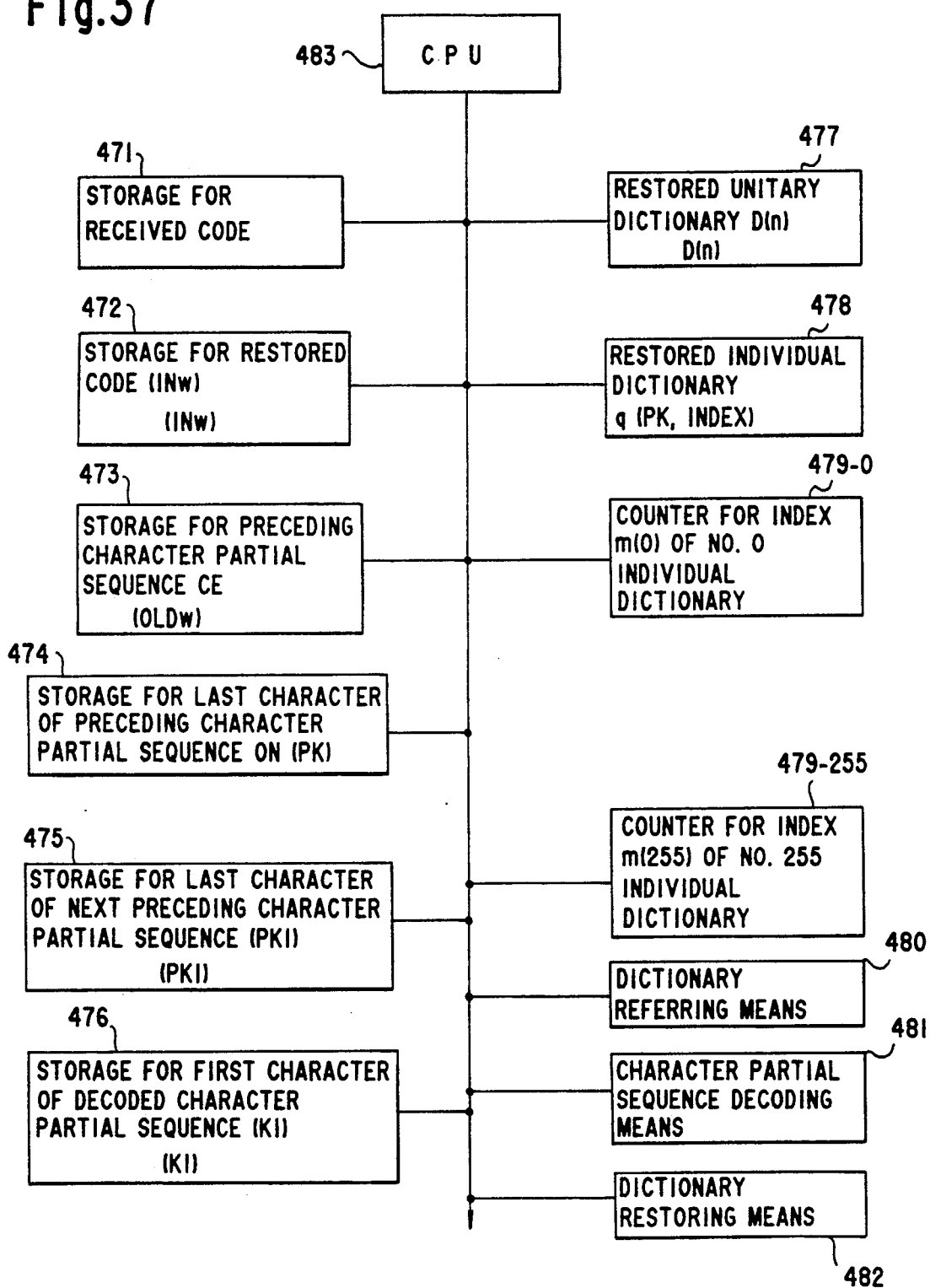

Fig.39
TREE OF DICTIONARY
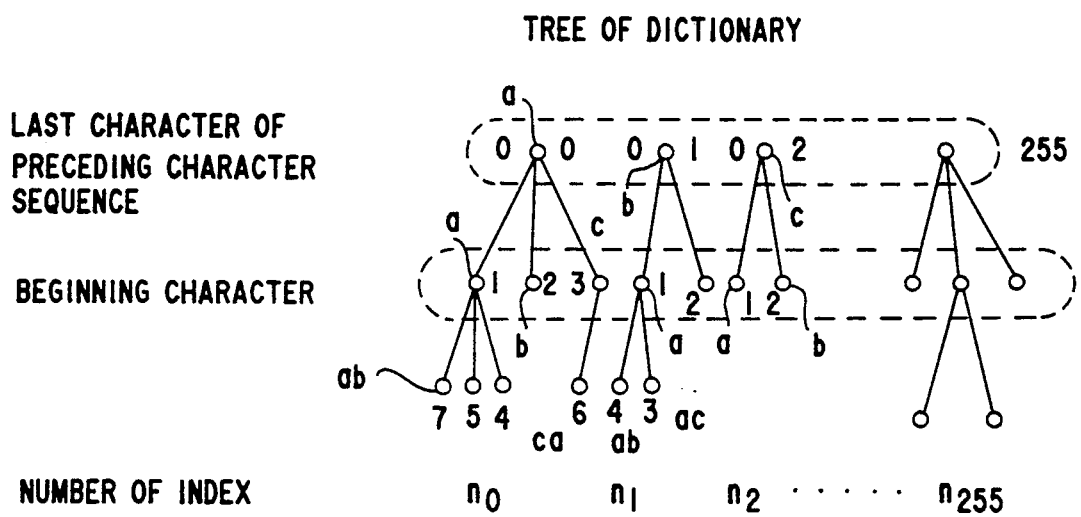
CODING PROCESS OF CHARACTER SEQUENCE (INDEX OF EACH TREE)
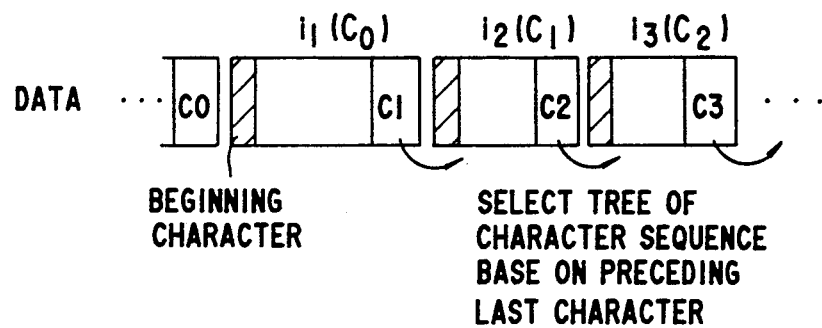

METHOD AND APPARATUS FOR COMPRESSION AND DECOMPRESSION OF DATA

This application is a continuation of application Ser. No. 07/768,201 filed Oct. 24, 1991, now abandoned.

TECHNICAL FIELD

The present invention relates to a method of compression and decompression of data, and more particularly to a method of compression and decompression of data in the LZW(Lempel-Ziv- Welch) system used for an incremental parsing type coding in a universal coding.

The process and apparatus according to the present invention is applicable, for example, in an image data compression system for computerized type setting (CTS) in a newspaper composition system, in a file compression in a filing device of an electronic computer system, in a data compression for storing in a storage medium, such as a magnetic disk, and the like.

PRIOR ART

In a prior art data compression in the LZW system, universality of data compression is given an importance. Thus, data coding is initiated in a state of dictionaries close to blank conditions, in which only the first characters or all single characters are registered.

Therefore, the data compression in the prior art LZW system, the amount that is learned small at the first portion of input data and thus the compression ratio is small.

In a coding in the LZW system, the universality is important. However, in the case where specific kinds of data frequently appear among various kinds of data, consideration has to be given to the point that it is not always necessary to perform coding when the dictionaries are almost blank. This should be true in decoding in the LZW system.

On the other hand, in a prior art LZW system, when coding is performed by separating the input character sequence into mutually distinct segments of a character sequence, the currently coded character sequences are regarded as appearing independently of the previously coded character sequences.

Accordingly, such a method creates no problem for an information source in which each character in the character sequence appears independently of the preceding characters, namely a memoryless information source. However, much data, such as practical phrases, are regarded as appearing dependent upon the preceding appearing characters, namely regarded as an information source having a memory. In the prior art, coding in a LZW system cannot use hysteresis of appearance of the character sequence, therefore, a problem of redundancy associated with dependency of appearance of the character sequence occurs, even after data compression.

It should be noted, in the file of the present invention, one word unit of data is called a character, data constituted by a plurality of sequential words is called a character sequence.

Incremental parsing type data compression and decompression in the prior art LZ system (Lempel-Ziv system) or the LZW system has been disclosed in Japanese Examined Patent Publication (Kokoku) 63-56726, U.S. Pat. No. 4,464,465 and U.S. Pat. No. 4,558,302.

DISCLOSURE OF THE INVENTION

One object of the present invention is to improve the compression ratio in data coding in incremental parsing manner by preventing the lowering of compression degree even at the initial portion of input data in coding and decoding for data compression and decompression in a LZW system.

Another object of the invention is to provide an improvement in compression ratio in data coding in incremental parsing manner by making the size of the reference dictionary large and thereby prevent lowering of the compression degree in data coding in an incremental parsing manner.

A further object of the invention is to provide higher efficiency in data coding by using an index based on the dependency to the last character of the immediately preceding coded character sequence, the dependency is integrated when coding and decoding is performed designating one of a plurality of dictionaries, and simplifies initial registration of the plurality of dictionaries.

A still further object of the invention is to provide enhanced compression ratio in data coding by reducing redundancy between character sequences by introducing the dependency relationship of the last character in the immediately preceding character sequence versus the partial sequence of character (string) to be coded when registration for the dictionary is performed by deriving a code of the current character sequence in relation to the immediately preceding character sequence, such as the last character in the immediately preceding character sequence.

According to one aspect of the invention, there is provided a method for compressing and decompressing data in the incremental parsing manner, in which coding is carried out by designating the reference number of a partial sequence having the maximum length coincidence from the coded string registered in a dictionary with regard to a received character sequence, designating a new reference number to a string obtained by adding one character to a reference number obtained as a code word, and registering the new reference number designated string in the dictionary, and a decoding is carried out by searching strings registered in the dictionary using a code word represented by the reference number of the string, decompressing the original string, designating a new reference number to a string which is obtained by adding the beginning character of the currently decompressed string to the previously processed code word, and registering the new reference number designated string in the dictionary.

The method in this aspect of the invention is characterized in that an initialization of the dictionary is carried out by registering, as an initial value in the dictionary, only strings having the highest frequency of occurrence among the strings registered in the dictionary using the coding with regard to sampled data, based on the determination that the string having the highest frequency of occurrence are already coded string.

On the other hand, according to another aspect of the invention, there is provided a method for compressing and restoring data in the incremental parsing manner, in which a coding is carried out by designating the reference number of a string having the maximum length coincidence from the coded strings registered in a dictionary with regard to a received character sequence, designating a new reference number to a string which is obtained by adding one character to a reference number obtained as a code word, and registering the new reference number designated string in the dictionary, and a decoding is carried out by searching strings registered in the dictionary using a code word represented by the reference number of the string, decompressing the original string, designating a new reference number to a string which is obtained by adding the beginning character of the currently restored string to the previously processed code word, and registering the new reference number designated string in the dictionary.

The another aspect of the invention is characterized in that the method comprises the steps of constituting a registration dictionary by registering a subsequent string for each of the last characters of the beginning string of successive two strings or each of groups based on the last character, designating a registration number of a string to be registered for each of the last characters or each of the groups based on the last character; and constituting a code word of string to be coded based on the designated registration number. Furthermore, a restoration of a dictionary is carried out from data formed by the constituted code word for each of the last characters of a string precedent to a decoded string, and decoding of a received code to a character string is carried out from the last character of a string precedent to the decoded string and the currently received code by using the decompressed dictionary.

BRIEF DESCRIPTION OF THE DRAWINGS

FIG. 13 is an illustration showing registration of an additional code;

FIG. 14 is an illustration showing data registered in a memory device corresponding a string;

FIG. 15 is an illustration showing operation for decoding;

FIG. 18 is an illustration showing an example of an optimal code conversion;

FIG. 20 is an illustration showing an example of a compressed code for which the optimal code is applied;

FIG. 22 is an illustration showing the order of rate of occurrence of transition between the character groups;

FIGS. 27, 27(A), and 27(B) together form an illustration showing algorithm of decoding;

FIGS. 32, 32(A), and 32(B) together contain a flowchart showing an operation of the coding device;

FIGS. 33 and 34 are illustrations showing examples of an overall dictionary and an individual dictionary;

FIG. 37 is an illustration showing an example of a device for decoding;.

FIG. 39 is an illustration showing examples of a tree of dictionaries and coding of character sequence.

DETAILED DESCRIPTION OF THE PREFERRED EMBODIMENTS

Before describing the preferred embodiments, respective discussion will be given for a prior art incremental parsing type data compression system with reference to FIG. 1, the process of coding in prior art LZW system with reference to FIG. 2, and a process of decoding with reference to FIG. 3.

Figure 1:
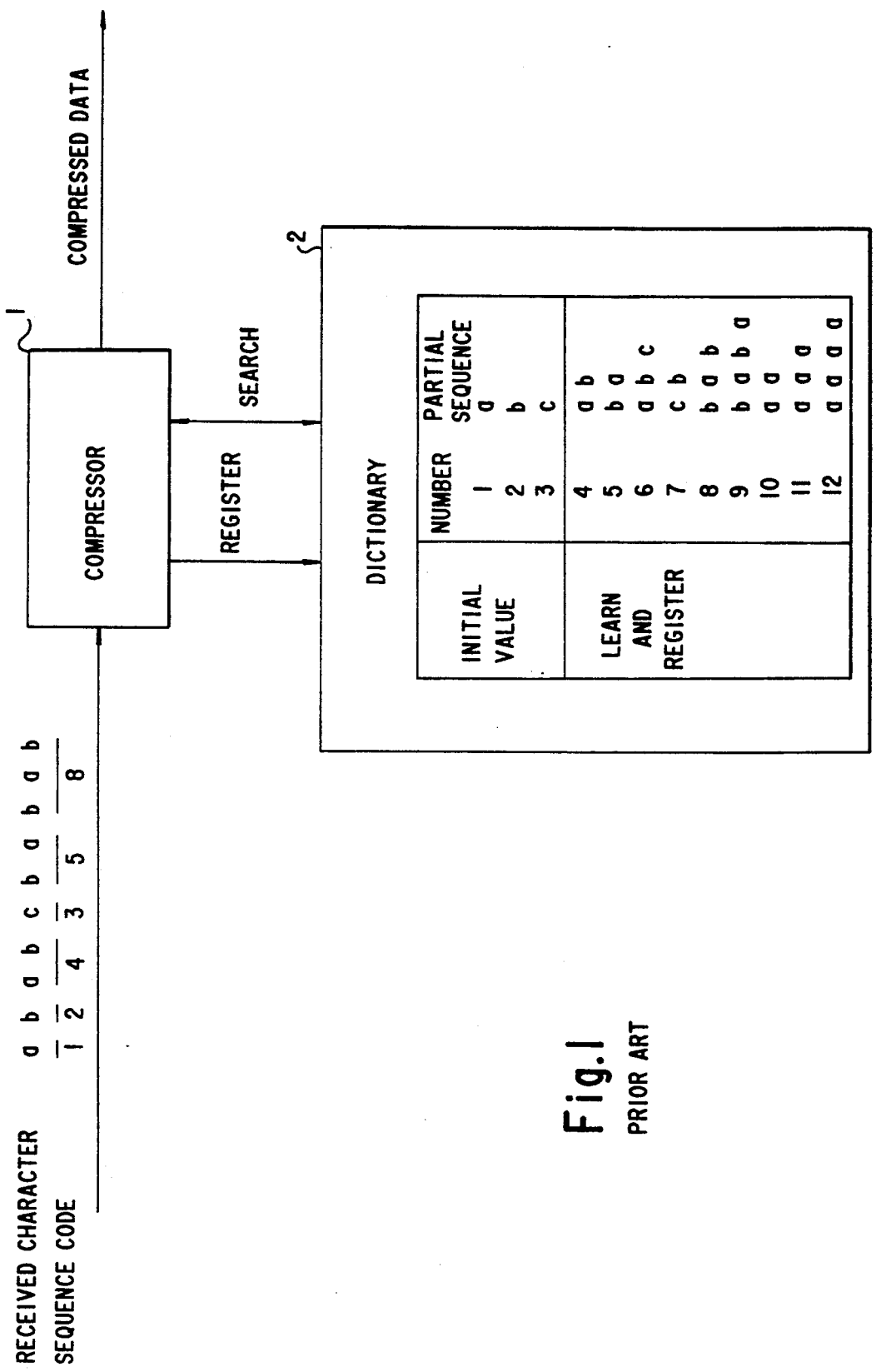
FIG. 1 is an explanatory illustration showing a prior art data compression and restoration method in incremental parsing type LZW system.

A data compression system of FIG. 1 has a compressor 1 and dictionary 2. A character sequence, for example, constituted of only characters a, b, c, ababcbabab, is input. With respect to the input character sequence, a string of individual characters a, b, c are respectively registered in the dictionary 2 as initial values corresponding to numbers 1, 2, 3. Strings of sequence of characters ab, ba, abc, cb, bab, baba, aa, aaa, aaaa are registered in the dictionary 2 corresponding to numbers 4 to 12 through learning. For the dictionary 2, the compressor 1 performs a search using the registered strings. In the compressor 1, compression is performed by using the strings registered in the dictionary 2 and the resultant compressed data is output.

In a prior art, an LZW system coding process which uses a re-writable dictionary, the input character sequence is divided into mutually distinct character sequences, i.e., strings. Such strings are registered in the dictionary with reference numbers in the order of appearance, and the currently input character sequence is described by the reference number of the character sequence registered in the dictionary and having a maximum length of coinciding sequence of characters.

Figure 2:
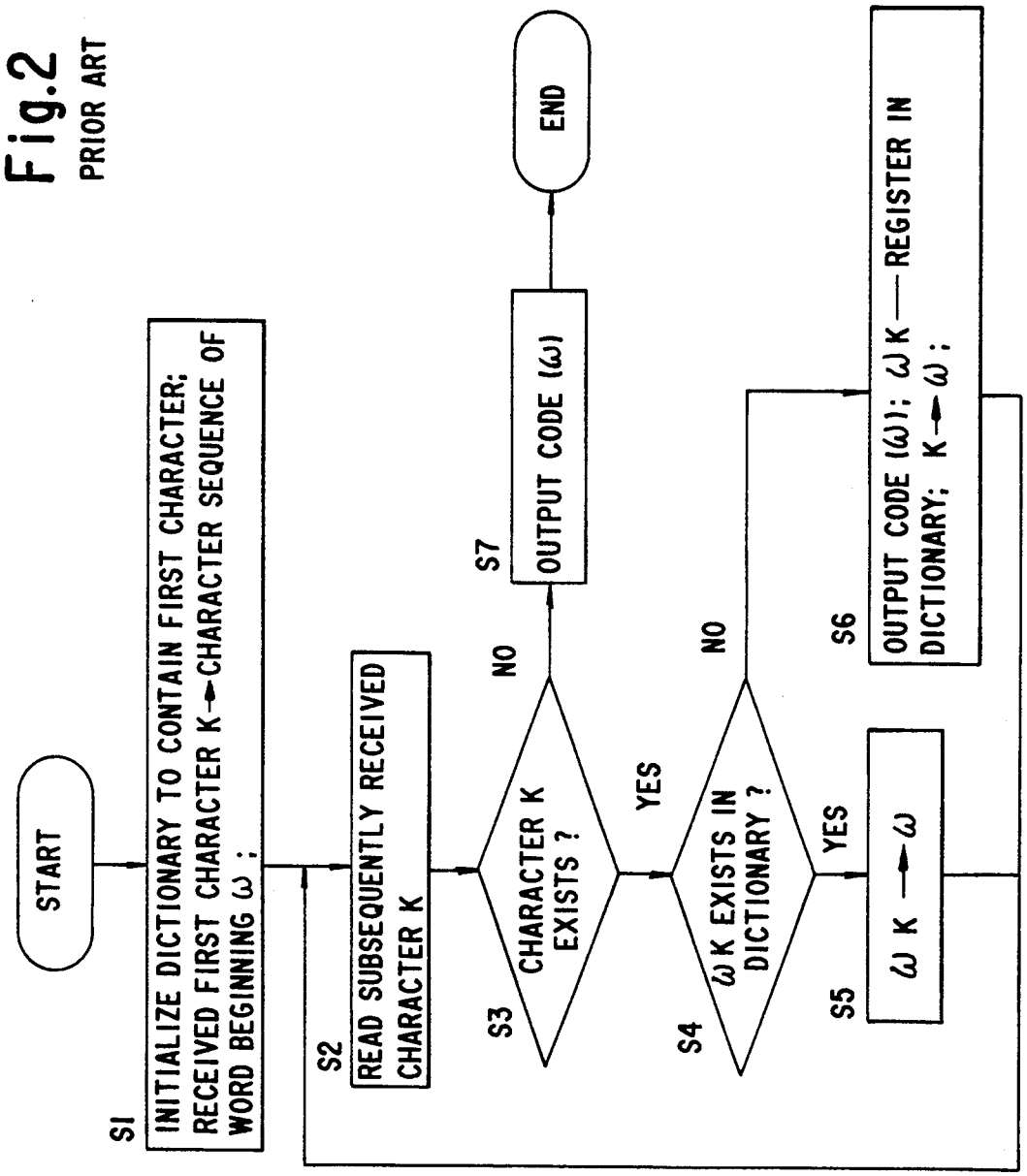
FIGS. 2 and 3 are illustrations showing a prior art process of coding and decoding in LZW system of incremental sparsing manner.

In the LZW system coding process of FIG. 2, coding is initiated after preliminary registering strings constituted of single characters for all characters in the dictionary in step S1. In the coding in step S1, a search against the dictionary is performed for the leading character K to find the reference number $\omega$ and set this as a prefix string. Then, the next character K of the input data is read out in step S2. Then, in step S3, a check is performed to determine if all input characters are read out. Subsequently, in step S4, search is performed against the dictionary for "$\omega$K" constituted by adding the character K read out in step S2 to the prefix string $\omega$. In step S4, when the string "$\omega$K" does not exist in the dictionary, the process advances to step S6 to output a code ($\omega$) representative of $\omega$ as the reference number $\omega$ for the string K obtained in step S1, and registers the string "$\omega$K" with a new reference number in the dictionary. Furthermore, the input character K in step S2 is replaced with the reference number $\omega$. Also, the address n of the dictionary is incremented. Then, the process returns to step S2 to read the next character K.

On the other hand, when the string "$\omega$K" is present in the dictionary, the string "$\omega$K" is replaced with the reference number $\omega$ in step S5. Then, the process returns to step S2 to repeat a search for finding the maximum coincidence until the string "$\omega$K" becomes impossible to find in the dictionary.

Figure 3:
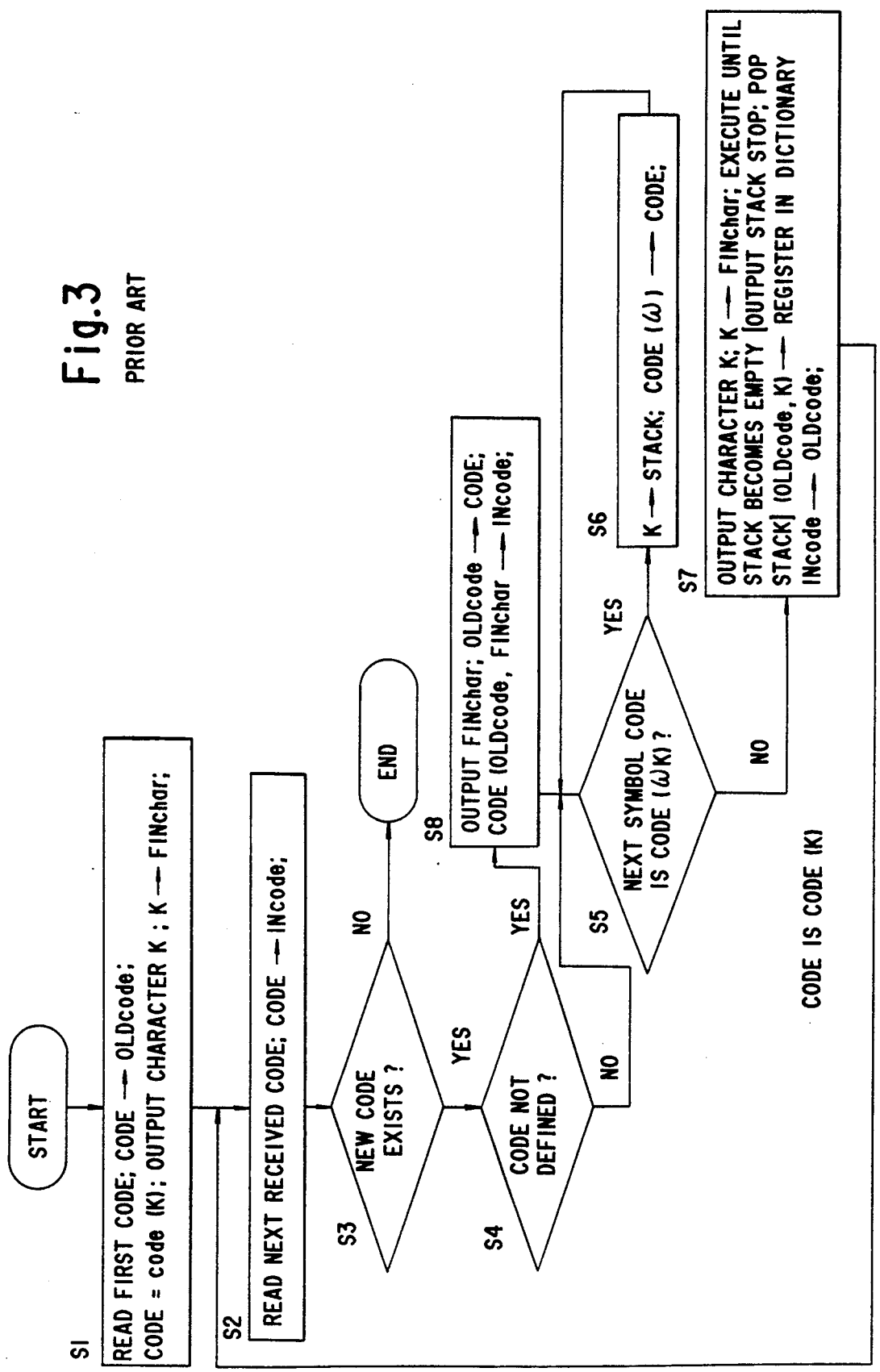

Decoding process in FIG. 3 is performed through the opposite operation to the coding in FIG. 2.

In decoding in FIG. 3, decoding is initiated after preliminary registering strings of single characters as initial values with respect to all characters, in the dictionary, similar to that done in coding.

First, in step S1, the first code, namely the reference number, is read out. Then, the current code is set as OLD code. Since the first code coincides with the reference number of one of the single characters already registered in the dictionary, the character code (K) coincidence with the input code is found out and the character K is output.

It should be noted that the character K is set in FINchar for later exception process. Then, the process advances to step S2 to read out the next code and set as INcode. In step S3, a check to determine whether the read out code is new code or not, namely, presence or absence of termination of code input, is performed. Then, the process advances to step S4 for checking whether the numeric code input in step S3 is defined, namely, registered in the dictionary, or not. Normally, the input code word is registered in the dictionary in the preceding process, process is advanced to step S5 to read out the string code ($\omega$K) corresponding to the numeric code from the dictionary. In step S6, the character K is temporarily stacked, and taking the reference number code ($\omega$) process returns to step S5. The processes of the steps S5 and S6 are repeated until the reference number $\omega$ becomes that for the single character K. Finally, the process is advanced to step S7 to output the characters stacked in step S6 in a LIFO (Last In First Out) manner. Simultaneously, in step S7, the precedingly used code $\omega$ and the beginning character K of the currently decompressed character sequence are combined and a new reference number is given for the string described as a "$\omega$·K" to register it in the dictionary.

Figure 4:
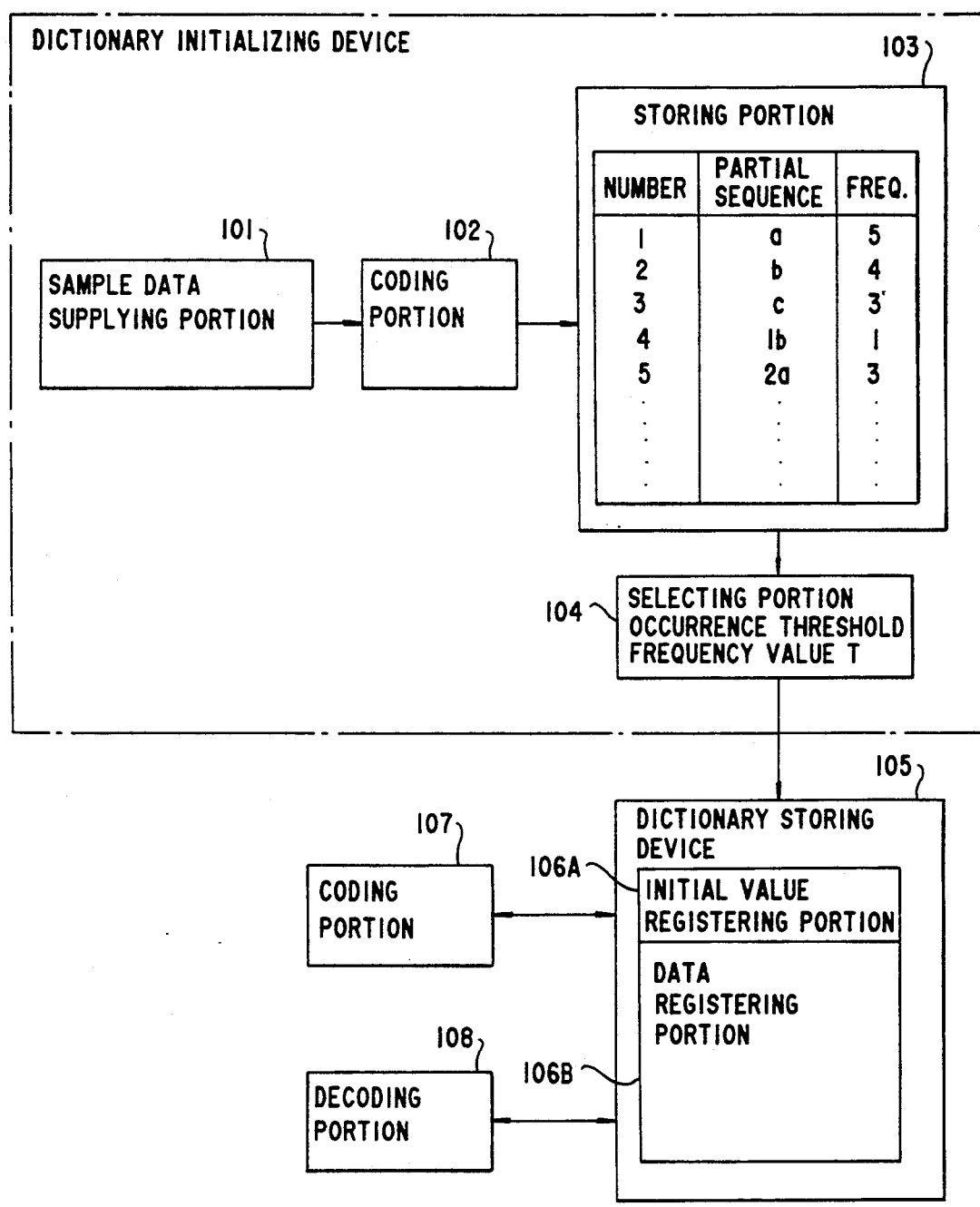
FIG. 4 is an illustration showing an exemplary embodiment of a system for implementing a method for data compression and decompression according to one aspect of the invention.

One aspect of a system for implementing a method for data compression and decompression according to the present invention is illustrated in FIG. 4.

In the system of FIG. 4, a data compression system using LZW code as an incremental parsing type code, in which, in coding, the input character sequence is coded by designation by a reference number of the maximum length coincidence string among already coded strings registered in the dictionary. Also, for the string identified by the reference number, the next single character is added to form a string to register a new reference number on the dictionary 105, and in decoding, with the code word identified by the reference number of the string, a search is performed against the dictionary 105 to restore the original string. Then, the beginning character of the currently decompressed string is added to the preceding decompressed string to register it in the dictionary by designating a new reference number.

In the system of FIG. 4, upon initialization of the dictionary 105, with respect to the desired samples of the character sequences, the strings appearing at high frequency among the strings registered in the dictionary through a coding process, are regarded as already coded strings and registered in the dictionary 105 as the initial values.

Figure 6:
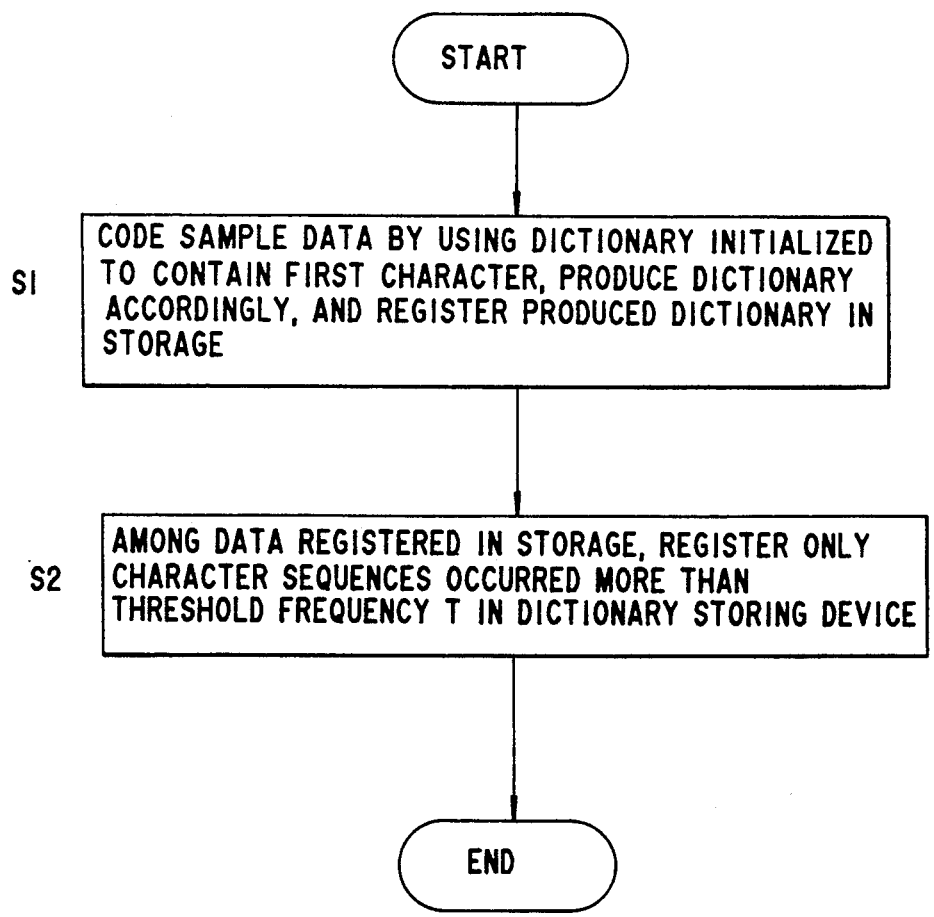
FIG. 6 is a flowchart showing an operation of the system of FIG. 4.

In the system of FIG. 4, data of the specific kinds which appear particularly frequently as input data are prepared as sample data, from various kinds of data. With this sample, a dictionary is established by LZW coding for the data of the sample appearing at high frequency, as shown in FIG. 6 (S1). Then, the dictionary is compressed by maintaining only strings appearing at high frequency in the established dictionary for making the initial values of the dictionary (S2).

Figure 7:
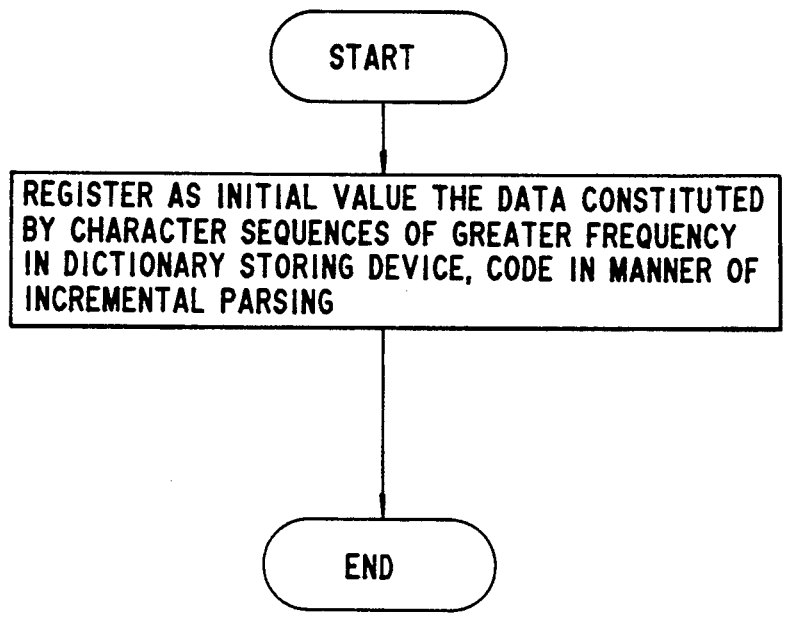
FIGS. 7 and 8 are flowcharts for discussion about operation associated with the flowchart of FIG. 6.
Figure 8:
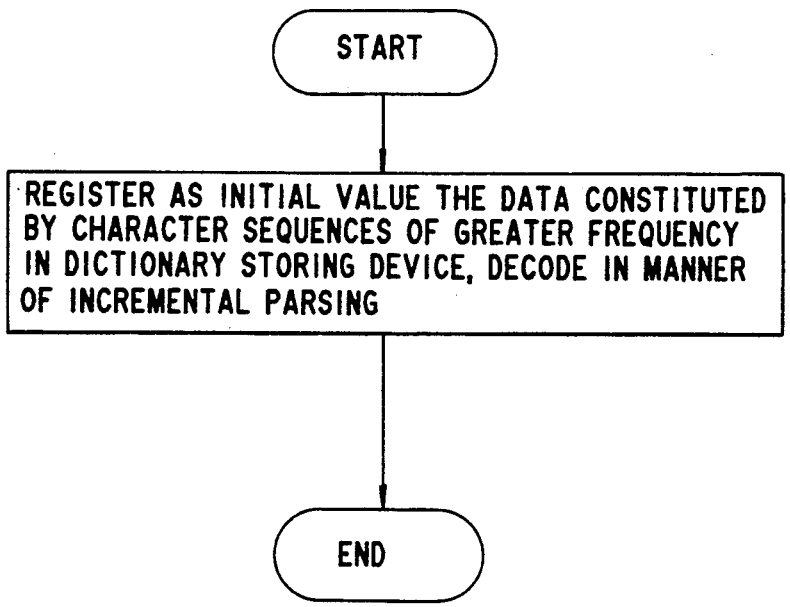

Then, as shown in FIGS. 7 and 8, after initializing a process for registering the initial values obtained through learning of the data of the sample, LZW coding and LZW decoding is performed so that even at the initial portion of the input data, sufficient amount of strings are registered in the dictionary and thus, an increased compression ratio can be obtained.

In practice, upon LZW coding of sample data, counters are provided for every reference number in the dictionary to count the occurrence of use of the relevant reference numbers during a coding process. Then, the strings having small counter values are erased from the dictionary and only strings having high appearance frequency are maintained to obtain the dictionary. Then, coding and decoding is performed either in a method to perform coding or decoding after the high appearance frequency of strings are registered in the dictionary as the initial value, or, as an alternative, in a method of coding or decoding by fixing the high appearance frequency strings as non-rewriting fixed portion at the beginning of the dictionary as the initial values.

Figure 5:
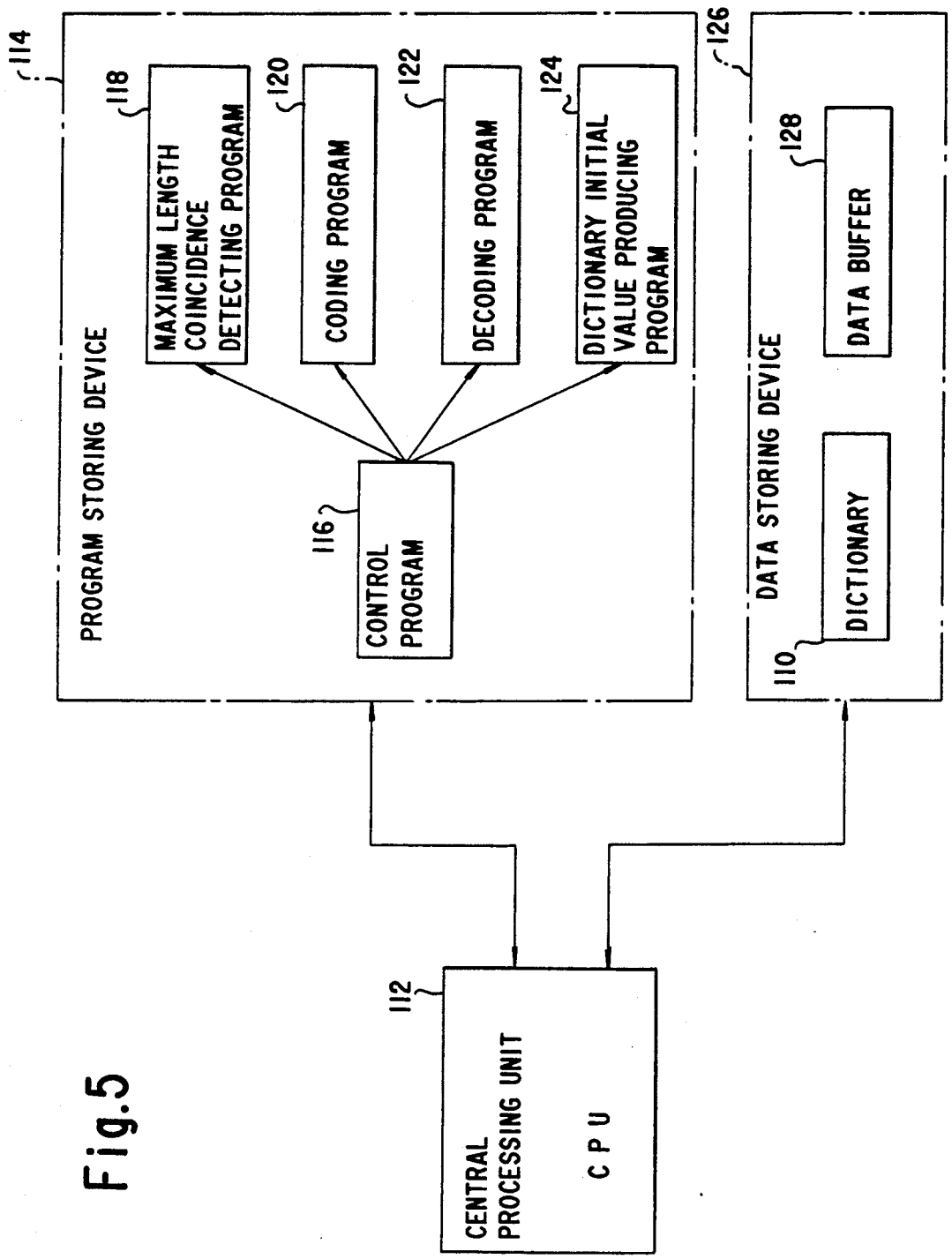
FIG. 5 is an illustration showing construction of a memory device for programs and a memory device for data employed in the system of FIG. 4.

The construction of a memory device for a program and a memory device for data used in the system of FIG. 4 are illustrated in FIG. 5. In the construction of FIG. 5, 112 denotes a CPU as a control means. To CPU 112, a program storage 114 and a data storage 126 are connected.

In the program memory, a control program 116, a maximum coincidence search program for searching maximum coincidence using a LZW code, a coding program 120 for converting the input character sequences into LZW codes, a decoding program for decompressing the codes converted into LZW codes by the coding program 120 into the original character sequences, and a dictionary initial value generating program 124 for generating a dictionary initial value with strings appearing at high frequency among the register of the dictionary obtained by a LZW coding with respect to the data of the desired sample, are provided.

On the other hand, in the data memory, there is provided a data buffer for storing character sequences to be coded or code sequences to be decoded, and a dictionary 110 used for coding and decoding with respect to a LZW code and updated from time to time.

Data compression in the construction of FIG. 5 will be discussed herebelow.

At first, in advance of coding and decoding, desired data of the sample is stored in the data buffer 128 of the data storage 126. As the sample data, specific kinds of data that statistically appear at high frequency are used. At the condition where the sample data are stored in the data buffer 128, CPU 112 initiates a dictionary initial value generating program 124 to perform a process of generation of the initial value of the dictionary. Practically, the dictionary initial value generating program 124 uses the coding program 120 to perform a LZW coding process with respect to the data of the sample in the data buffer 128 and registers data constituted by the coded strings with the reference numbers in the dictionary 110 in order. At registration for the dictionary, the counters are provided with respective reference numbers. When a search for the maximum coincidence is performed via the reference numbers of the strings, the counter is incremented at every occurrence. Therefore, the frequency of appearances of respective strings can be counted.

When the LZW coding is completed with respect to the sample data, the dictionary initial value is generated by compressing the dictionary 110 in such a manner that, among the dictionary 110 obtained in the data memory, only strings having a count in the counter greater than or equal to a threshold value T are maintained.

The dictionary initial value thus obtained is stored in a specific region in the data memory and registered in the dictionary 110 during initializing process for coding and decoding. On the other hand, it is also possible to maintain the dictionary initial value in the leading portion of the dictionary that is used for coding and decoding, and make the portion of the dictionary initial values as a re-writing inhibiting region.

Next, the process of generation of the dictionary initial value with the data of the sample will be discussed herebelow with reference to FIG. 9.

At first, at step S1, the dictionary is initialized to contain the first character of the character sequence constituting the data of the sample. Namely, the first character code i is registered in the address i of the dictionary. Next, taking a count n of registered number of strings as number of characters n of all single characters, the reference number $\omega$ obtained through a search on the dictionary for the first character K of the successively input characters, is set as a prefix string $\omega$.

In the initialization at step S1, it is possible to register all single characters of the character sequence constituting the data of the sample with the reference numbers in the dictionary.

Then, the process is advanced to step S2. The next input character K is read out. In step S3, a check is performed to determine whether the character K is present, namely a check is performed to determine whether reading of the input character sequence is completed or not. Then, the process is advanced to step S4. In step S4, a check is performed to determine whether a string "$\omega$K", which is constituted by combining the reference number $\omega$ of the beginning input character, i.e. prefix string $\omega$, with the second input character K, is present in the dictionary.

At this time, since only two characters are input, the character sequence "$\omega$K" is not present in the dictionary. Therefore, the process is advanced to step S5 to register the string "$\omega$K" in the address n of the dictionary. Then, the second character K is replaced for the prefix string "$\omega$". Also, a count cnt(n) for counting the occurrence of the appearance of the reference number "$\omega$" is generated and reset to zero. Furthermore, the count n, representative of the number of current registration, is incremented.

In step S4, if the string "$\omega$K" is present in the dictionary, the process is advanced to step S5. Then, the string "$\omega$K" is replaced with the prefix string "$\omega$". By this, since the reference number "$\omega$" is used, the count cnt(n), representative of the string of the reference number $\omega$, is incremented.

When processing of all characters is completed by repeating the above-mentioned process through steps S2 to S6, the process jumps from step S3 to a step S7 to write the final address and content of the dictionary obtained at that time into the memory device and then, the process for generating the dictionary is terminated.

Figure 10:
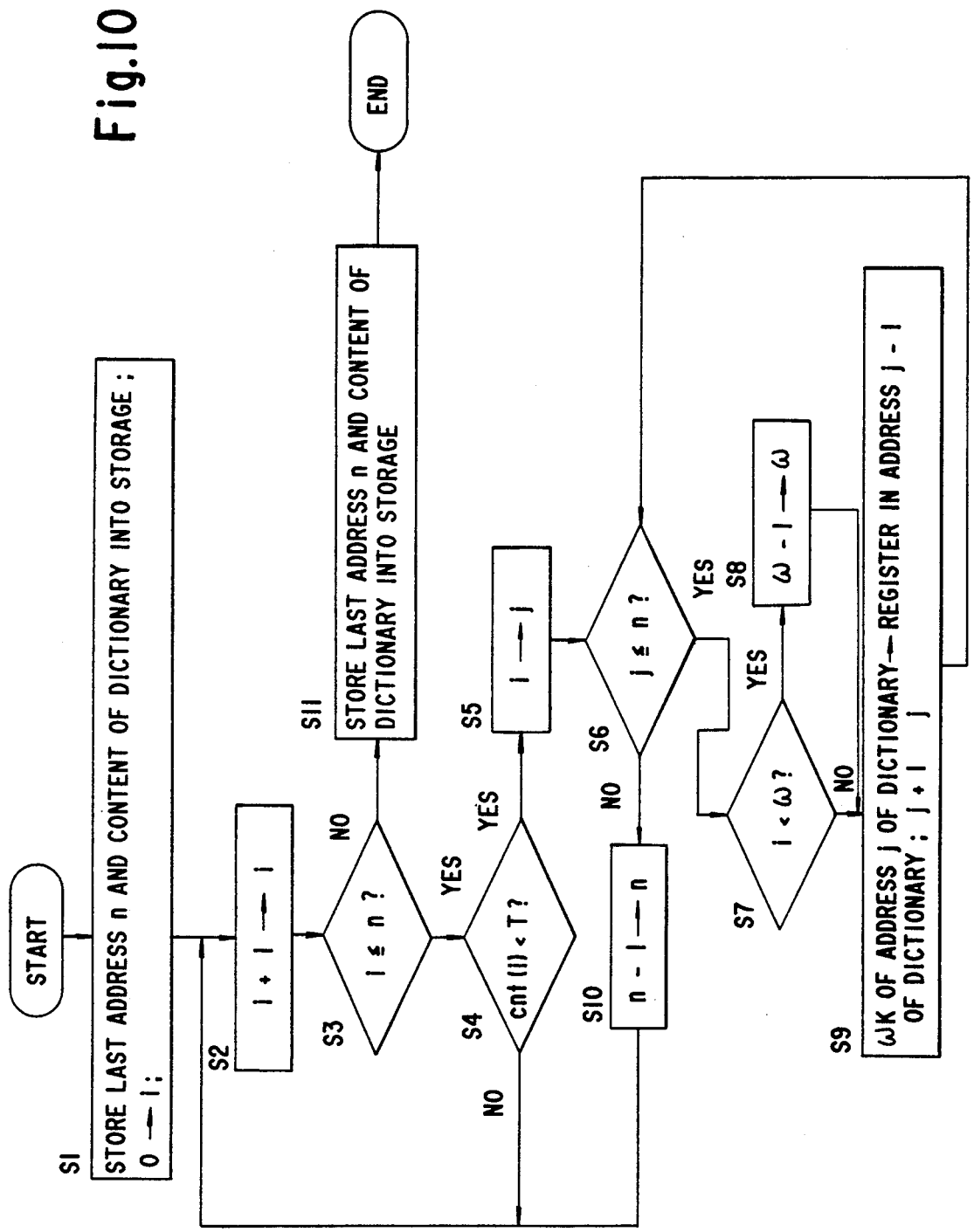
FIG. 10 is a flowchart showing a process of compression of a dictionary.

With respect to the dictionary thus generated, a process for compressing the dictionary only for maintaining strings having a high appearance frequency, is shown in FIG. 10.

Figure 9:
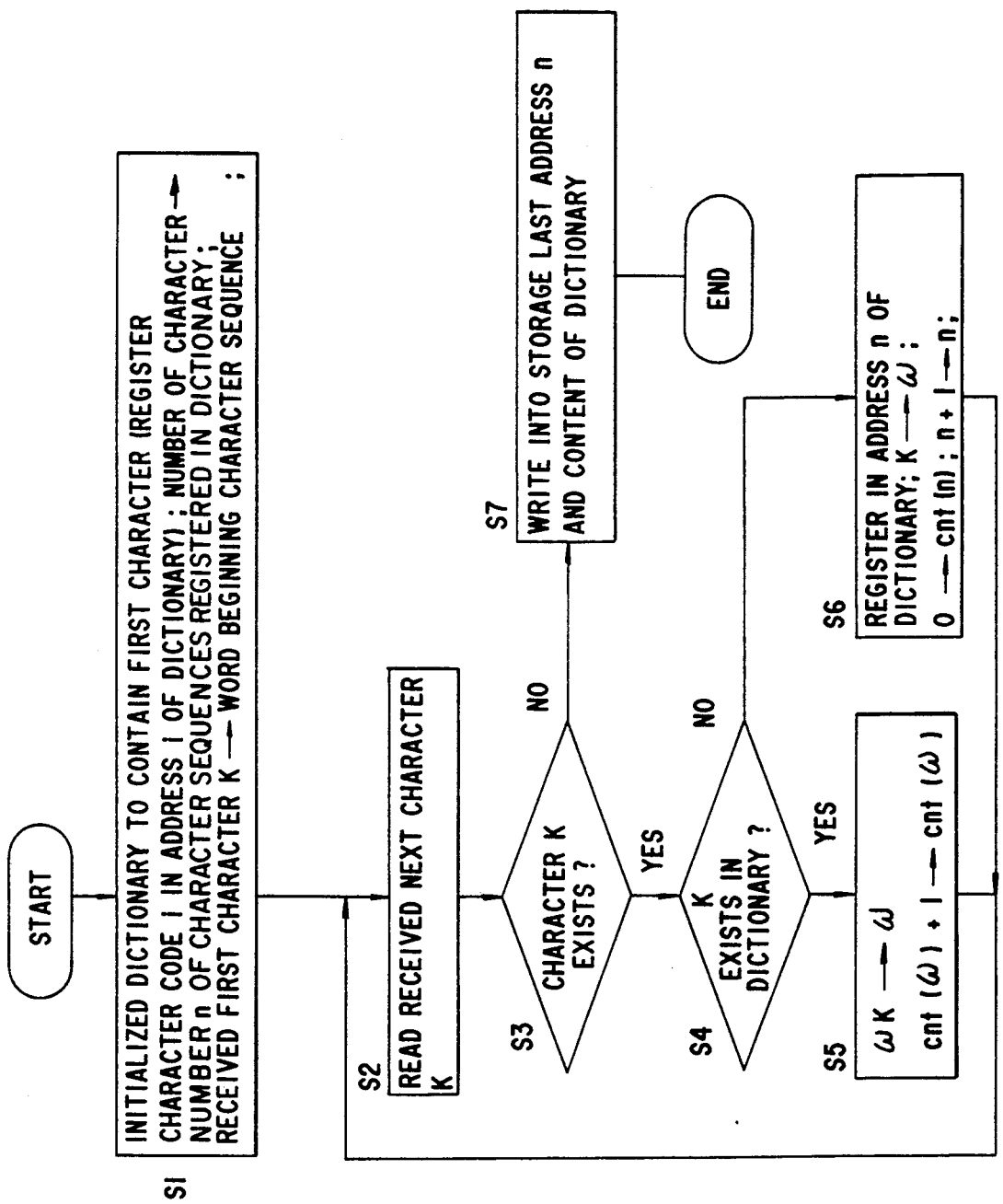
FIG. 9 is a flowchart for showing a process of generation of the initial value of a dictionary with sample data.

At first, in step S1, the last address and the content of the dictionary obtained through the process of FIG. 9 is written in the memory. Then, the address i of the dictionary is reset to zero.

Subsequently, in step S2, the address of the dictionary is incremented. In step S3, a check is performed to determine whether the last address is reached. Then, the process is advanced to step S4 to check whether the count cnt(i) of the dictionary address i is smaller than the threshold value T representative of the predetermined appearance frequency.

When the count cnt(i) is smaller than the threshold value T, the process advances to step S5 to perform an erasure process for erasing the current dictionary address i and replacing the dictionary address i with the dictionary address j. Subsequently, in step S6, a check is performed to determine whether the dictionary address j immediately following the erased dictionary address i is within the last address n. If it is within the last address n, then the process is proceeded to step S7 to perform a check to determine whether the strings having a greater reference number $\omega$ than i=$\omega$ in the dictionary addresses following the address i.

When the string having a reference number greater than the reference number ω in the addresses following the erased dictionary address i, the process is proceeded to a step S8. Then, the value of the reference number of the strings are decremented by "1". Then, in step S9, the string "ωK" in the dictionary address j is registered at a preceding dictionary address j−1. Thereafter, the processes dictionary address j is incremented to j+1 for the next process cycle and then, the process returns to step S6. The processes of steps S6, S7, S8 and S9 are repeated until the dictionary address j exceeds the final address n. Namely, processes are repeated in such a manner than, when the strings having a lower appearance frequency that the threshold value, the reference numbers of the strings in the succeeding addresses of the address of the erased strings are decreased by 1 and the register address thereof are shifted by 1.

When the processes through steps S6 to S9 are completed, the process is advanced to step S10. Since one string has been erased, the final address n is decremented by 1. Then, the process returns to step S2 to increment the dictionary address i and to perform a check of the appearance frequency of the next string. The processes are repeated until the final address n is detected in step S3.

When the fact that the last address n is reached is detected in step S3, then the process is progressed to step S11 to write the last address n and the content of the dictionary in the memory device to complete generation of the compressed dictionary initial value.

Figure 11:
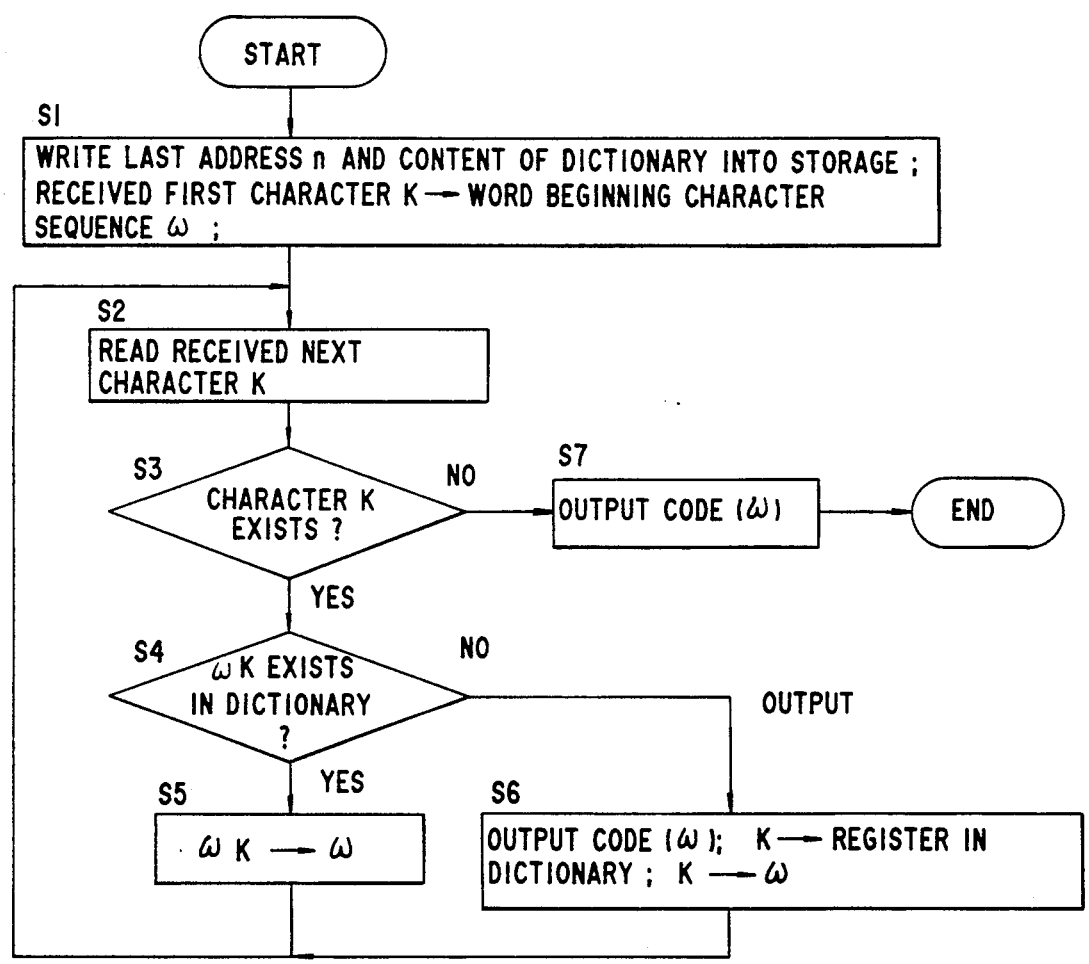
FIG. 11 is a flowchart showing a coding process.

The flowchart of the coding process using the dictionary initial value thus generated is shown in FIG. 11.

In coding, at first, in step S1, the dictionary initial value generated with respect to the data of the preselected sample is read out from the memory device and the last address n of the read out dictionary and the content of the dictionary are written in the memory to be used as a dictionary. This process of writing the dictionary initial value is the point that is different from the coding process in the prior art. Subsequently, in step S1, for the input first character K, a search is performed on the dictionary to put the reference number of the coincidence string as the prefix string. Then, in step S2, the next character K is input. In step S3, a check is performed to determine whether character input is terminated or not. Thereafter, a check is performed to determine whether the string "ωK" which is composed by combining the currently input character K to the prefix string ω, exits in the dictionary.

In the conventional method, at the initial stage of the input data, the ratio of presence of the string (ωK) is in the dictionary is small. In the flowchart of FIG. 9, since the dictionary initial value obtained through learning the sample data is already stored, it is determined that the string "ωK" is present in the dictionary in step S4 and the process is advanced to step S5 to replace the prefix string ω with the string "ωK" to return the process to step S2. Subsequently, the search process for finding the maximum coincidence is repeated until the results of the search becomes impossible to obtain. As a result, even for reference of the input data, the chains of strings that can be searched from the dictionary can be increased to improve the compression ratio.

Of course, when the string (ωK) is not found in the dictionary, the process is advanced to step S6 to output the current reference number ω as code(ω) and a string composed of the currently processed reference number ω and the next character K, is registered in the dictionary with a new reference number. Then, the prefix string is replaced with a new single character. Thereafter, the process returns to step S2 to perform a coding process for obtaining the maximum coincidence of a new string.

Figure 12:
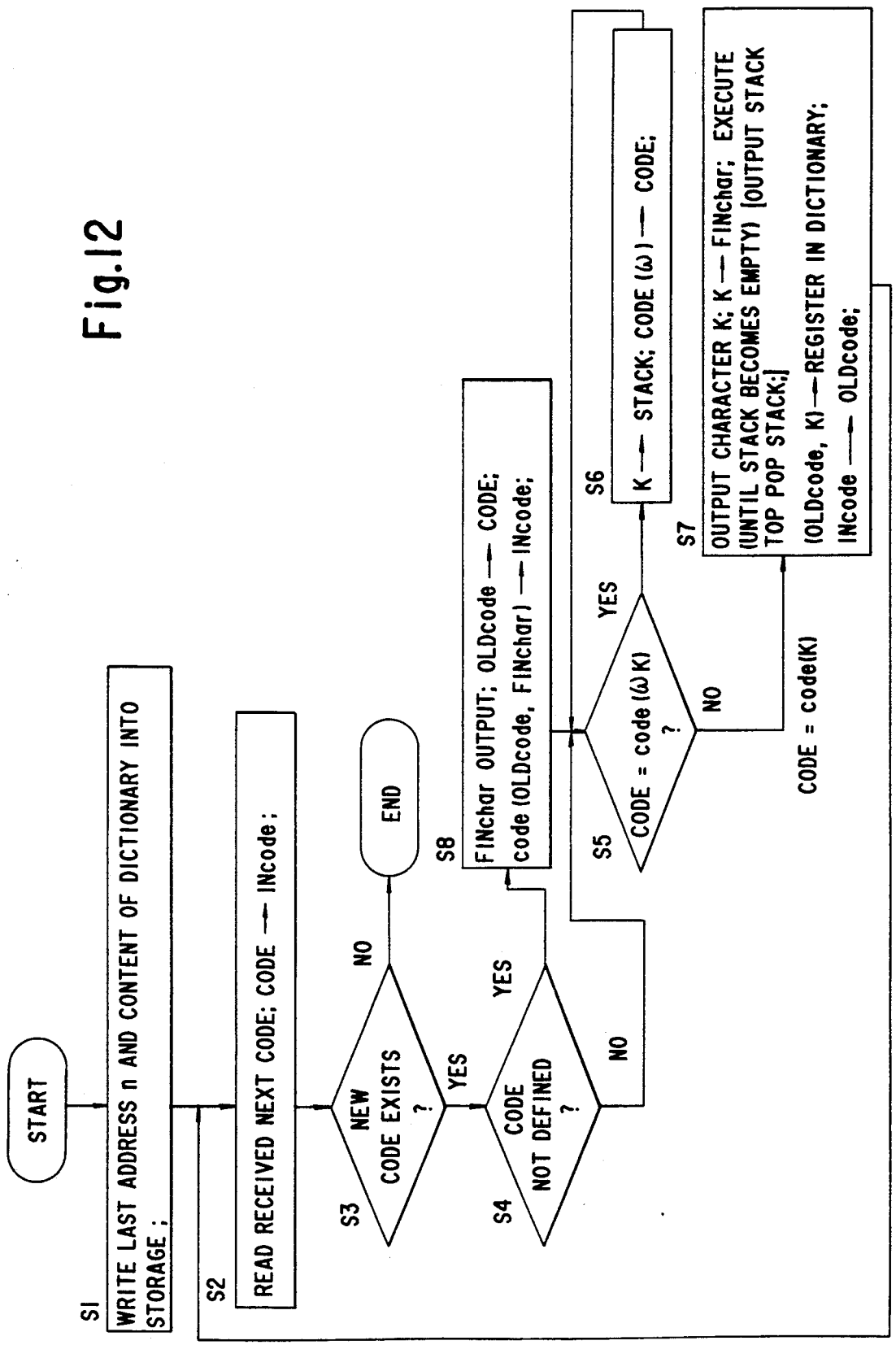
FIG. 12 is a flowchart showing a decoding process.

The flowchart of the decoding process is illustrated in FIG. 12. In step S1, the dictionary initial value obtained though the processes of the flowchart of FIGS. 9 and 10 is read from the memory and the final address and the content of the read dictionary is written in the memory, which is used as a dictionary for decoding.

Once registration of the dictionary initial value, which has already been obtained, at the dictionary is completed, the first code is read out in step S2. In step S3, a check is performed to determine whether the read out of the code input is completed. Then, in step S4, a check is performed to determine whether the code is defined in the dictionary. When it is determined that the code is defined in the dictionary in step S4, the process is advanced to step S5 to read out the string "ωK" having the corresponding reference number. Once the string "ωK" is obtained, the character K is stacked in step S6. Then, for the reference number ω excluding the character K, a search is performed to obtain the next string "ωK" in step S5. The processes of steps S5 and S6 are repeated until the reference number ω returns to the character K. Subsequently, in step S7, the sequence of characters stacked in step S6 are output in the LIFO manner.

In step S4, when the string is not defined in the dictionary, an exception process is performed in step S8, which is rarely initiated because of registration of the dictionary initial value, and occurrence is significantly reduced. Therefore, decoding from the code to the character sequence almost can be done without performing the exception processing.

As set forth, with respect to decoding, since the registration is already present as strings in the dictionary, even for the first code, decoding of the flowchart of FIG. 12 can be decompressed into the string even for the beginning code. In contrast, in the conventional manner of decoding, decompression must be initiated for the beginning character.

It should be noted that, in coding and decoding of FIGS. 11 and 12, coding or decoding is started after registration of the initial value of the dictionary from the memory device, the invention should not be limited to this specific process but can set the initial value of the dictionary at the leading section of the dictionary as an inhibited section which cannot be re-written, thus inhibit erasing during initialization of the dictionary and perform coding and decoding using such a dictionary.

Although, in the foregoing description, the initial value of the dictionary is generated with respect to a single character sequence forming the data of the sample, the process should be not restricted to the above-described process, and it is possible to generate the initial value of the dictionary from the data composed by connecting data of a plurality of samples. Furthermore, it is also possible that after registering the initial value generated with respect to data of one sample, a process is performed to generate the dictionary with respect to data of another sample and to extract only strings having high appearance frequency in the thus generated dictionary to accumulate such extracted strings to make up the initial value of the dictionary common to data of a plurality of samples.

Figure 16:
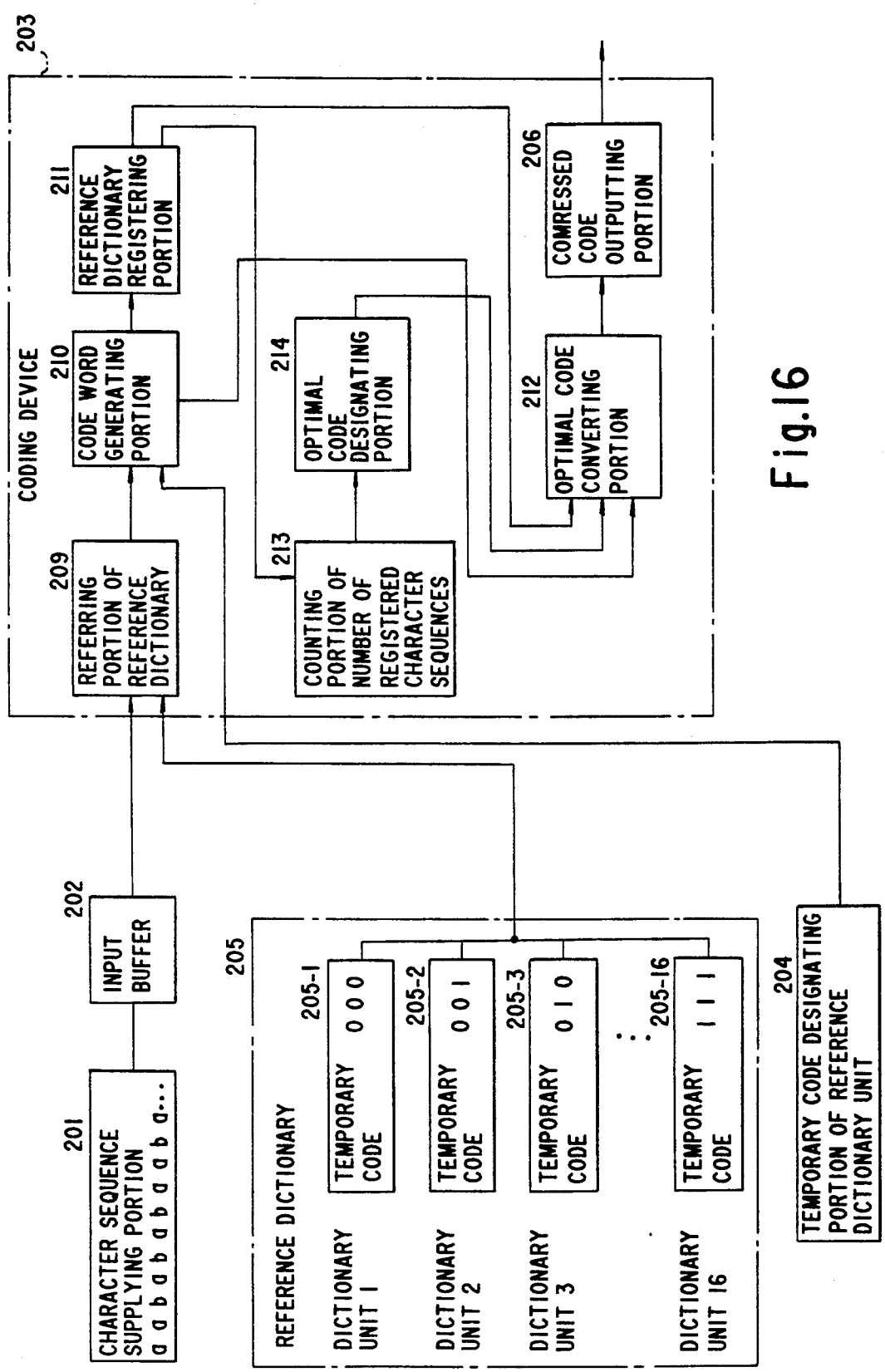
FIG. 16 is an illustration of exemplary embodiment of the system for implementing the method of data compression and decompression according to another aspect of the invention.

An example of a system for compressing and decompressing data according to another aspect of the present invention is shown in FIG. 16.

In the system of FIG. 16, 201 denotes a character sequence supply portion, 202 denotes an input buffer for temporarily storing the input character sequence and 203 denotes a coding device which comprises a reference dictionary referring portion 209 for comparing the input data with the reference dictionary, a code word generating portion 210, a reference dictionary registering portion 211 for registering the strings in the reference dictionary, an optimal code converting portion 212 for determining optimal codes for each of the reference dictionary units, a registered strings counting portion 213 for counting the number of registered characters with respect to each of the reference dictionary units, and an optimal code designating portion 214 for designating the optimal code for each of the reference dictionary units. Reference number 204 denotes a temporary or provisional code designating portion for provisionally designating codes representative of the reference dictionary units before the optimal values are set, and Reference number 205 denotes the reference dictionary which is constituted of a plurality of reference dictionary units, which is illustrated in the form constituted with 16 groups of the reference dictionary units. For example, the reference dictionary units may store the code words of strings of the strings corresponding to the character sequences of mutually different character groups, such that the reference dictionary unit 205-1 includes strings having the beginning character a, the reference dictionary unit 205-2 includes strings having the beginning character b. Reference number 206 denotes a compressed code outputting section.

With respect to the operation of the system FIG. 16, the example of conversion from the provisional code to the optimal code with respect to the code word format, is illustrated in FIG. 18. The cord word format 217, illustrated is composed of a code 218 of the reference dictionary unit and an index 219 representative of the register position of the reference dictionary unit. The code word 221 after conversion into the optimal value for the reference number with respect to the code word format 220 according to the provisional code of the reference dictionary unit, is illustrated.

The operation of the system of FIG. 16 is as follows.

First, the input character sequence 201 is stored in the input buffer 202. By the reference dictionary comparing means, the character sequence is compared with respective reference dictionary units 205-1, 205-2, . . . 205-16 for selecting the maximum coincidence character string among the previously registered strings.

Then, at the code word generating section 210, the code word format 217 is generated with the number 218 of the reference dictionary unit including the selected string and the index 219 showing the register position of the selected string in the reference dictionary unit. At this time, until the compression process for all characters of the input character sequence are transmitted at one time, the identification code of the reference dictionary unit is maintained at the provisional code set by the provisional code setting means 204.

Then, the reference dictionary registering section 211 performs registration for the string composed of the segment of the input character sequence that coincides with the maximum coincidence and the next character in the corresponding reference dictionary unit.

Here, the registered string counting section 213 counts the number of registered strings, namely, the number of data registered in the dictionary for the strings having the beginning character, for example, or, as an alternative, the rate of occurrence of transition to each of the reference dictionary units in which the string succeeding from the reference dictionary unit, including the last character of the character sequence ahead of a random character sequence, belongs.

Once the compression process for all characters transmitted at one time is completed, the optimal code setting section 214 derives transition certainty for respective reference dictionary units on the basis of the registered string numbers of respective reference dictionary units and the occurrence of transition between the reference dictionary units, so as to set shorter code words for the reference dictionary units having a high registered string number or high transition certainty than that of the code word given for those having a low registered string number or low transition certainty.

With the optimal code thus obtained, the optimal code converting section 212 converts the code words generated from the provisional codes for the reference dictionary units into the optimal code.

An example of the code word 220 described by the provisional code of the reference dictionary unit is illustrated. Also, the example of the optimal code 221 of the reference dictionary unit converted from the code word 220 is illustrated.

Figure 17:
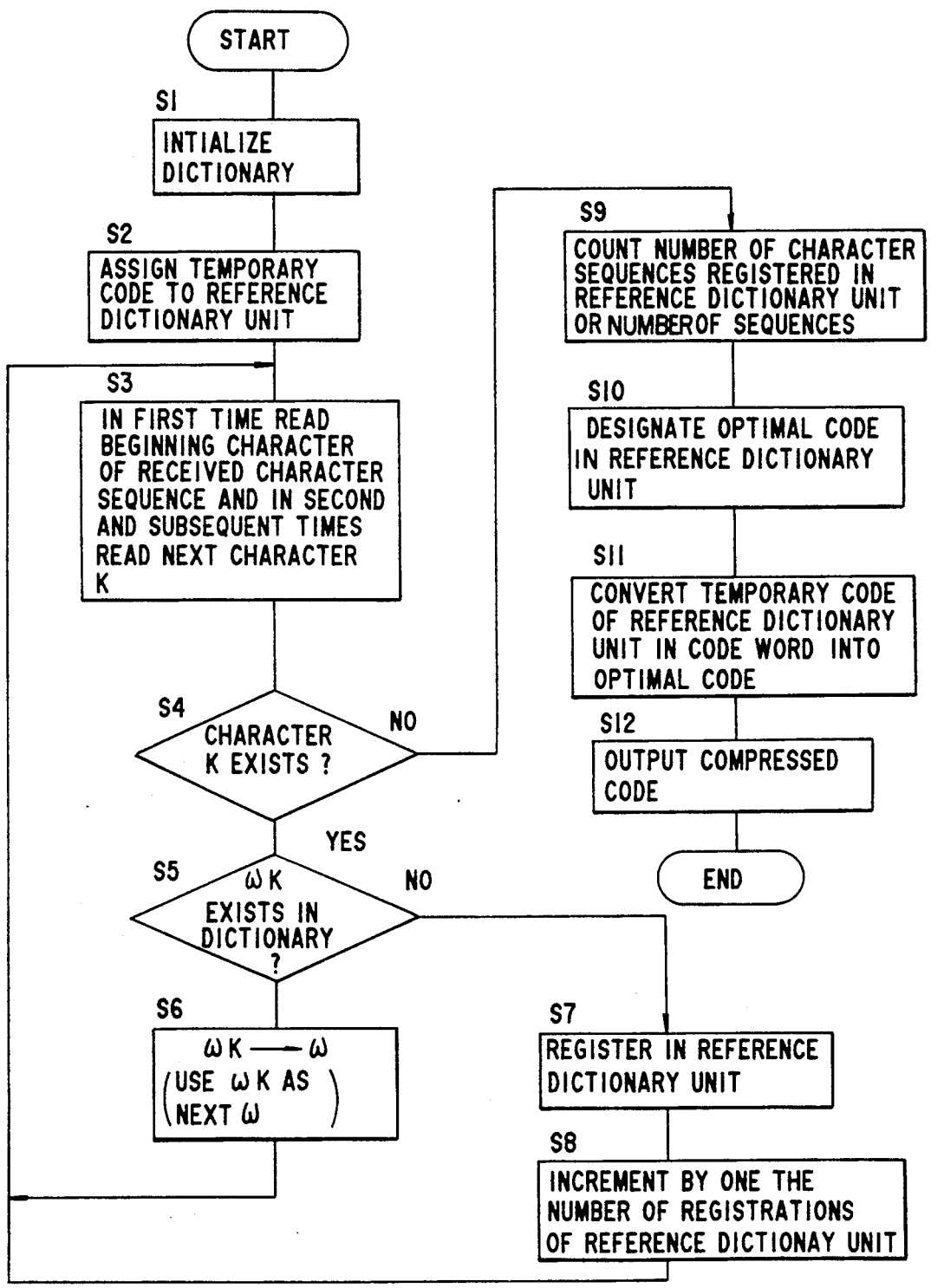
FIG. 17 is a flowchart showing a process for generating a compressed code.

A flowchart showing a process of generation of the compressed code is illustrated in FIG. 17.

In FIG. 17, $\omega$ denotes the registered strings, K denotes a character symbol next to the string coincidence with the registered string $\omega$ in the reference dictionary. The processes are as follows:

(S1) The reference dictionary is initialized.

(S2) For example, for the reference dictionary units, provisional codes are impartially given.

Subsequent processes will be separately discussed with respect to the processing of the beginning character of the input character sequence (first), and the processing of the second and subsequent characters (second).

FIRST

Process of Reading Out the Leading Character of the Input Character Sequence:

(S3) The beginning character of the input character sequence is read.

(S4) A check is performed if there is a character next to the read out character. If present, the next existing character is read out. Next, since the case that the next character is not present in (S4) indicates completion of the compression process by reading out all input characters, the process is normally advanced to step (S5) except for the case when a single character only is to be transferred.

(S5) At the step of reading out the beginning character of the input character sequence, there is naturally no possibility of writing in the dictionary, the process is advanced to step (S7).

(S7) In registering the string, at this time the beginning character of the input character sequence corresponds to index of the reference dictionary, registration of the code is performed.

(S8) In order to count the registered strings or the rate of occurrence of transition to each of the reference dictionary units in which the string succeeding from the reference dictionary unit belongs, including the last character of the character sequence ahead of a random character sequence, the register number is incremented by 1. Then, the process returns to (S3) to read out the next character to repeat (S4).

SECOND

Process for the Second and Subsequent Characters in the Input Character Sequence:

(S3) The next character K is read out.

(S4) If there is no character, it means that the process up to the last character for the transferred document is completed.

(S5) When a read out character in (S4) exists, the process is advanced to (S5), If the string $\omega K$ is not found, processes of steps (S7) and (S8) are again performed, and the process returns to step (S3).

(S6) When $\omega K$ exists in the dictionary in (S5), since the string has already been registered, $\omega K$ of the strings for comparing the character sequence with the reference dictionary, is replaced with $\omega$. Then, the process again returns to step (S3) to read out the next character to repeat the process. When no character is detected at (S4), since the process of all characters is completed, the process is advanced to step (S9).

(S9) The number of strings registered in each reference dictionary unit or the occurrence of the transition between the reference dictionary unit is counted.

(S10) In consideration of the number of registered strings in the reference dictionary unit and the rate of occurrence of transition between the reference dictionary units, the optimal code for the reference dictionary unit is set.

(S11) A conversion process is performed for converting the provisional codes provided in the code words and representative of the reference dictionary units into the optimal codes.

(S12) Compressed code is output.

As set forth above, even when a large size reference dictionary is used, since the dictionary is divided, the index of the register strings can be described with short codes and thus can effectively generate the codes.

Although the code words are increased by dividing the dictionary, by making the codes representing the reference dictionary unit as variable length code the ratio of the code words in the compressed code of the all input character sequence can be reduced.

As set forth, even when the dictionary is made into a large size, the codes of indexes will not become longer and the compression ratio cannot be reduced, but satisfactory data compression corresponding to making the dictionary larger can be obtained.

Figure 19:
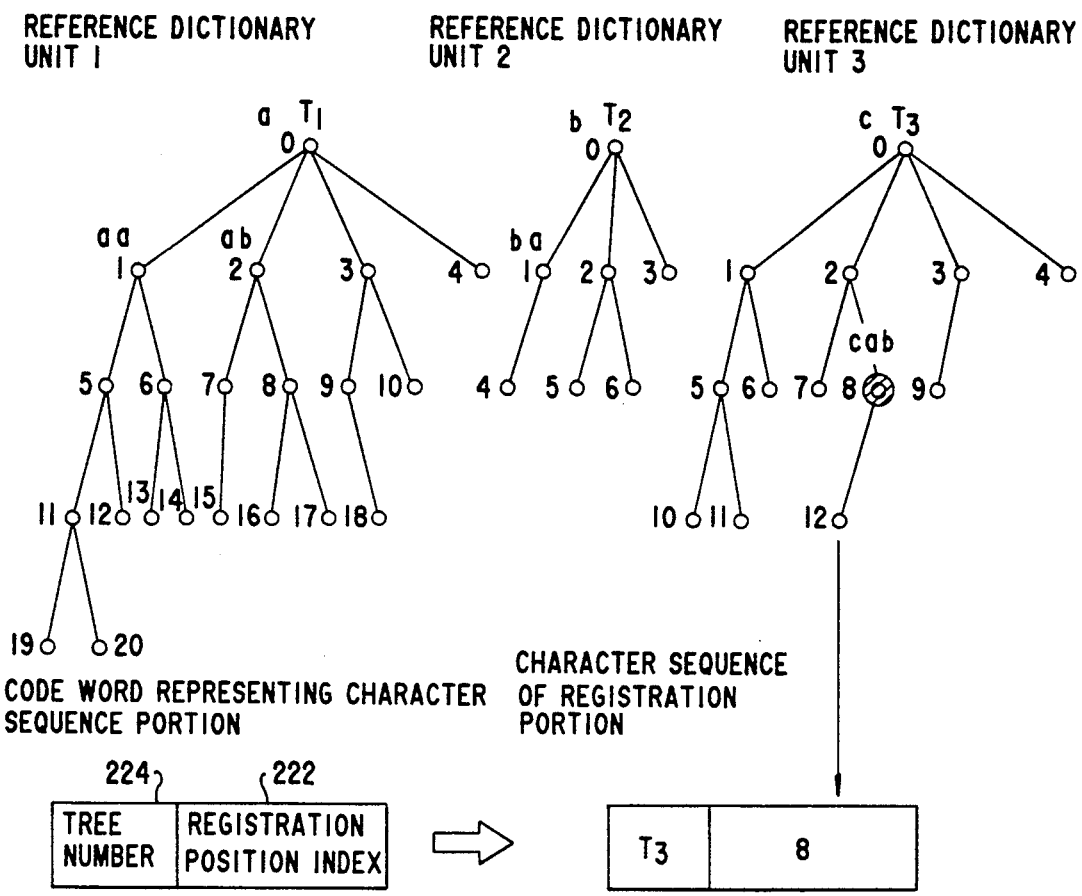
FIG. 19 is an illustration showing an example of setting an optimal code for respective of a reference dictionary.

An example of setting the optimal code for the unit of the reference dictionary is illustrated in FIG. 19.

In FIG. 19, an example of assignment of indexes for register components for the case that three reference dictionary units are provided.

For example, when the character string is constituted of only a, b, and c, $T_1$ is a group of the strings having a as the beginning character, $T_2$ is a group of strings having b as the beginning character, and $T_3$ is a group of the strings having c as the beginning character. The strings are registered to the reference dictionary units corresponding to the beginning characters.

Instead of assigning an index number corresponding to each node, a number is practically given in order of registration.

As shown in FIG. 19, the code word describing the character string is constituted of a tree number 224 which represents the number of the reference dictionary unit and the index 222 which represents the registered position.

For example, the string registered at register position 8 of the reference dictionary unit 3 ($T_3$) can be described by the number of the reference dictionary unit $T_3$ and the register position 8 as shown in FIG. 19.

In FIG. 19, as shown, the number representative of the reference dictionary unit, namely the tree number, for the tree having a large number of nodes, such as $T_1$ having 20 nodes, short cord "0" is assigned. On the other hand, for the trees having a small number of nodes, such as $T_2$, $T_3$, longer codes "10" and "01" are given.

The compressed code for which the optimal code is applied is shown in FIG. 20.

In FIG. 20, the system for converting an incremental parsing type ZL system (Ziv Lemple system) for the input character sequence aabababaaba . . . will be discussed.

In FIG. 20, the compressed code of the input character sequence, the compressed code derived by compression of the input character sequence when the numbers of the reference dictionary units are described by the provisional codes "000" and "001" are shown.

In FIG. 20, the compressed code of the input character sequence when the provisional codes of the reference dictionary units are converted into the optimal codes are also illustrated.

Figure 21:
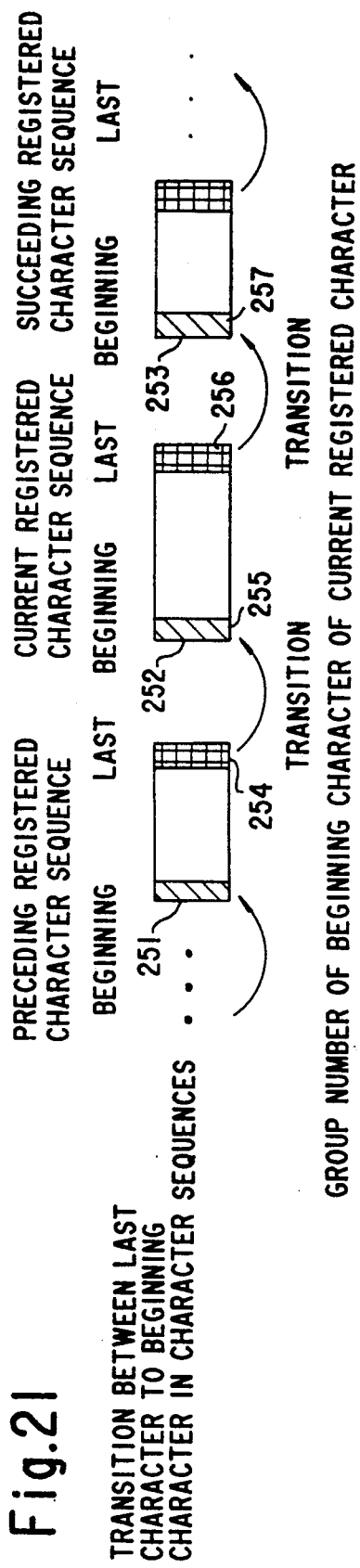
FIG. 21 is an illustration showing the result of a measurement for the number of occurrences of a transition between character groups.
Figure 23:
FIG. 23 is an illustration showing an example of optimal code and code word by transition code.

FIGS. 21 to 23 show other examples.

FIG. 21, is an example of the transition from the last character to the leading character in the sequential character sequence component. In the table of FIG. 21, the results of the measurement of the rate of occurrence of the transition between the character groups are shown.

In FIG. 21, reference number 251 denotes one preceding registered string with respect to the currently registered string, 252 denotes the currently registered string, 253 denoted the next registered string, 254 is the last character of the one preceding registered string 251, 255 denotes the beginning character of the currently registered string, 256 is the last character of the currently registered string, and reference number 257 denotes the beginning character of the next registered string.

In FIG. 21, the reference dictionary units, namely the roots of the tree in FIG. 17, is set as 16, the certainty of transition between the trees in which respective characters belong in view of the transition between the last characters and the beginning characters in the series of character sequence. When, the probability of transition is high, the short code is set and when the certainty is low the longer code is selected. Such codes are assigned together with the index as the code word.

In FIG. 21, the measured values for the occurrence of transmission to the group number, in which the beginning character of the currently registered string from the group number, in which the last character of the one preceding string belongs, namely 16 groups, in the tree of FIG. 19.

In FIG. 21, each figure represents the number of appearances. For example, from the group number 4 to the group number 6 the rate of occurrence of the transition is shown as 83 times.

FIG. 22 is re-written data of the measured value of FIG. 21 in order to determine the order of occurrence of the transition.

In FIG. 22, an order is given for the occurrence of transition from the group number, wherein the last character of the preceding registered string belongs to the group number, wherein the beginning character of the currently registered string, with respect to any preceding group number.

Numeral 0 indicates the fact that the number of transitions is maximum, and numeral 15 indicates the fact that the number of transitions is minimum.

For example, the order of transition from the group number 4 of the preceding registered string to the group number 6 of the current registered string, is shown as a second highest order among transitions to the group number of the current registered string in all cases.

In FIG. 23, the method for assigning the optimal code for the reference dictionary unit, namely the group number of FIG. 21, based on the result of FIG. 21 is shown.

In FIG. 23, an example of the code for assigning the code word according to the order of frequency of the transition between the registered strings group numbers is shown.

The short code is given for a high appearance frequency, and, to the contrary, a long code is given when the appearance frequency is low.

Here, the coding process for the currently registered string in the group number 6 is considered.

Then, the group number of the preceding registered string is assumed to be 0.

In this case, as shown in the table of FIG. 22, the frequency is 10. For this, an optimal code 1110101 is assigned.

In FIG. 23, the code word is shown.

As set forth, in order to interpret the code word, it requires the reference dictionary unit, in which the last character of the preceding string. However, since the last character of the preceding string is fed to the compressed code sequence which is output, the group number of the current group can be distinguished from that output.

Figure 24:
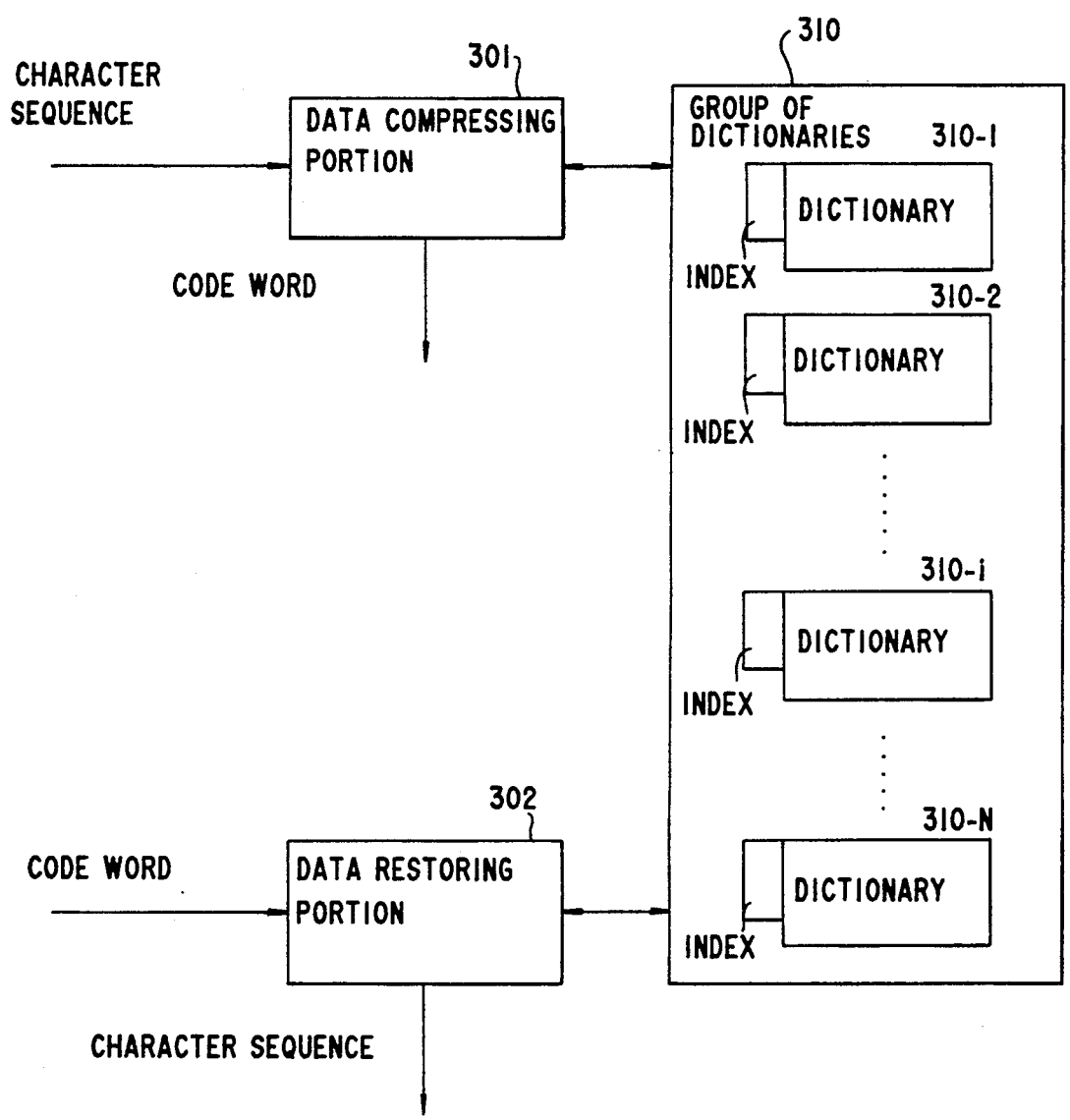
FIG. 24 is an illustration of an exemplary embodiment of the system for implementing the method of data compression and decompression according to a further aspect of the invention.

An example of a system for data compression and decompression according to another aspect of the invention is illustrated in FIG. 24.

The system of FIG. 24, illustrates coding of the input character sequence into a LZW system code by identifying the string of maximum coincidence in the registered already coded strings in the dictionary 310, with the reference number.

In the system of FIG. 24, the dictionary 310 is constituted of a dictionary group including a predetermined number of dictionaries 310-1 to 310-N, the number of which is smaller than the number of all character kinds. For each dictionary, all character kinds are initially registered with reference numbers.

In the process of coding the input character sequence, the specific dictionary 310-i is identified among the dictionary group according to index information representative of history, namely, dependency to the previously coded string. At the same time, when the input character sequence cannot be found in the designated dictionary, the string composed by adding one character for the previously coded string is registered with the new reference number.

In the process of coding the input character sequence, the specific dictionary 310-1 is identified among the dictionary group according to index obtained from the part of the last character code of the previously coded string. More practically, according to the index information represented by the upper bit of the last character code of the immediately precedingly coded string, the specific dictionary 310-i is identified among the dictionary group.

On the other hand, in the process of coding the input character sequence, it is also possible to identify the specific dictionary among the dictionary groups according to the index information obtained through table look up in terms of the last character code of the immediately precedingly coded string. Practically, the specific dictionary 310-i is identified among the dictionary group according to the index information obtained by looking up the table in terms of the upper bit of the last character code of the immediately precedingly coded string.

The system of FIG. 24 is directed to the data decompression system for decompressing the original character sequence from the coded code word by designating the reference number of the maximum coincidence string among the already coded strings of the input character sequence registered in the dictionary. The dictionary 310 is constituted of dictionary groups including a predetermined number of dictionaries 310-1 to 310-N, the number of which is smaller than the number of all character kinds. For each dictionary, all character kinds are initially registered with reference numbers. Upon restoration of the input code, restoration is performed by identifying one of the specific dictionaries 310-1 among the dictionary groups according to the index information representative of the dependence to the previously restored string. At every restoration, the string composed by adding the leading character of the currently decompressed string to the reference number of the previously decompressed string to register with the new reference number. Here, the designation of the specific dictionary 310-i is the same as that for coding.

With the system of FIG. 24, the following effect can be obtained.

At first, the hysteresis representative of the dependency of the trailing character of the immediately preceding string is 256 conditions as original. Since the appearance of the characters has inclination, some conditions among the 256 conditions will rarely appear. By marking the history of the last character to reduce the conditions to obtain a meaningful smaller number of conditions, e.g. 8 to 16 conditions. Thus, the number of dictionaries can be reduced.

Since the number of states of the history is small, the number of the registrations of all 256 kinds of characters as initial values to each dictionary is the number of the history, i.e., the number of dictionaries multiplied by 256, so that the waste of the processes is not significant.

As an approach for reducing the history, by taking, for example, by taking the upper 4 bits of the last character of the already coded immediately preceding string, the history naturally becomes 16 kinds. As an approach to reduce the history, it is desirable to form the conditions appearing in order to use the dictionary effectively. However, it is not necessary to use raw data in the character, and instead it may be possible to reduce the number of hysteresis by designating historical conditions of the immediately preceding string, namely, the index of the dictionary, by preparing a look-up table (LUT) correlating with the final character of the immediately preceding coded string to the hitorical condition.

Figure 25:
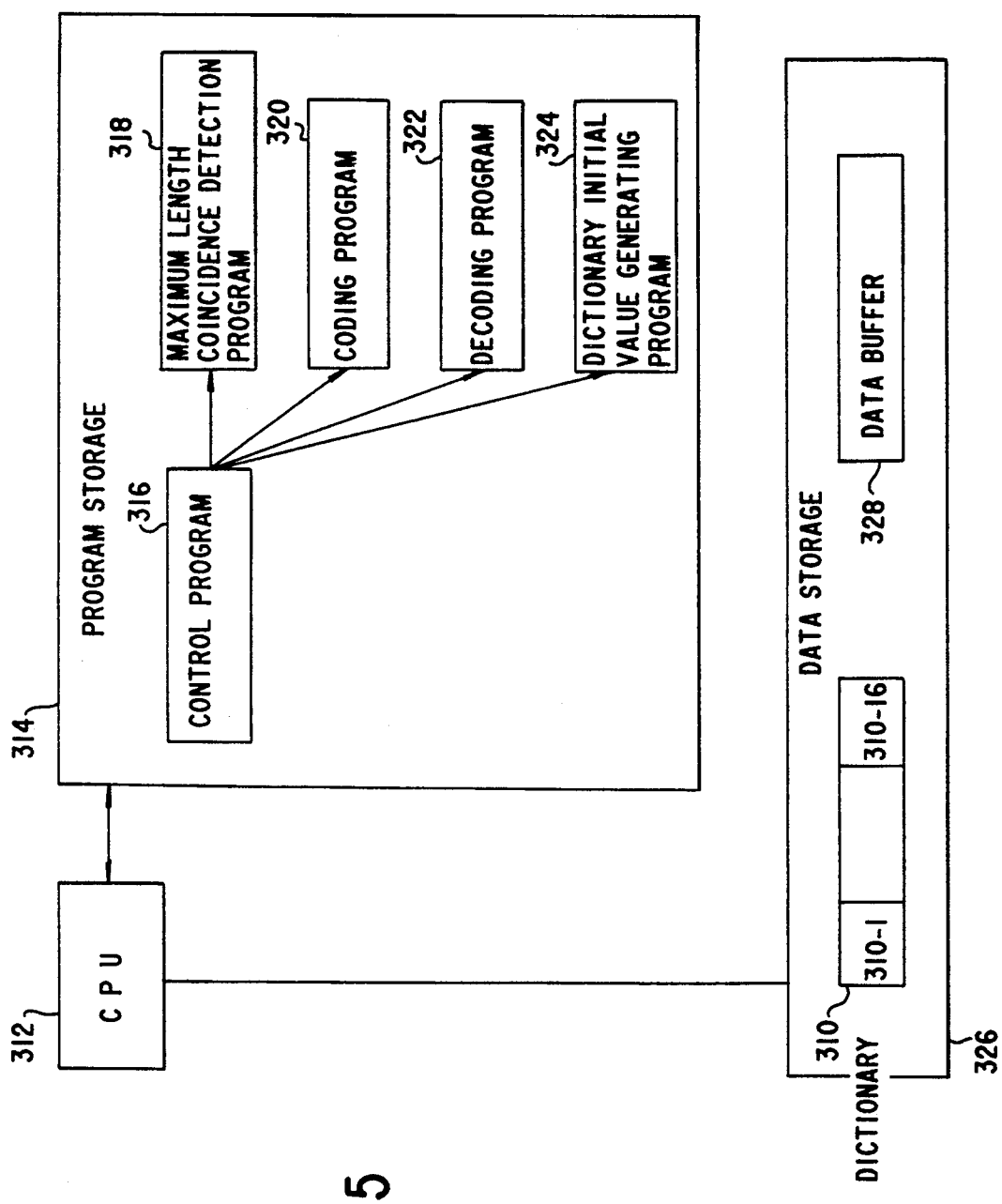
FIG. 25 is an illustration showing a memory device for storing a program and a memory device for storing data.

The construction of the program memory device and the data memory device for the system of FIG. 24 are illustrated in FIG. 25.

In FIG. 25, reference number 312 denotes CPU as the control means. To the CPU 312, the program storage 314 and the data storage 336 are connected.

The program storage 314 stores a control program 316, a maximum coincidence search program 318 for searching the maximum coincidence utilizing the LZW code, a coding program 320 for converting the input character sequence in the LZW system code, a decoding program 322 for LZW code converted by the coding program 320 into the original character string, and the dictionary initial value generating program 324 for initially registering all character kinds, e.g., 256 character kinds, of the object for process.

In the data storage 326, there are provided a data buffer 328 for storing the character sequence to be coded and code sequence to be decoded are stored, and the dictionary 310 which is used during the coding and decoding concerning the codes of the LZW system and which is simultaneously successively produced. The dictionary 310 consists of 16 dictionaries 310-1 to 310-16 for 256 kinds of characters, when it is classified by the index information representative of dependency by the upper 4 bits of the last character code of the already coded string. Though the index of the dictionary with the upper 4 bit of the last character code of the coded string can be done directly, the following discussion will be given to the manner of designation by reading the index of the dictionary with reference to the look-up table (LUT).

Data compression and restoration will be briefly discussed below.

Under the control of the control program 316, CPU 312 triggers the dictionary initial value generating program 324 to perform the process of generation of the dictionary initial value. In practice, the dictionary initial value generating program 324 registers each of the 256 kinds of characters with respectively assigned reference numbers to the 16 dictionaries 310-1 to 310-16.

The data buffer 328 of the data storage 326 temporarily stores, for externally entered data, a plurality of characters of a predetermined length, to be coded. The data buffer transfers in the manner of one character by one character in accordance with the demand from the coding program 320. Then, every time the data buffer becomes empty, it receives a plurality of characters in a similar manner.

Figure 26:
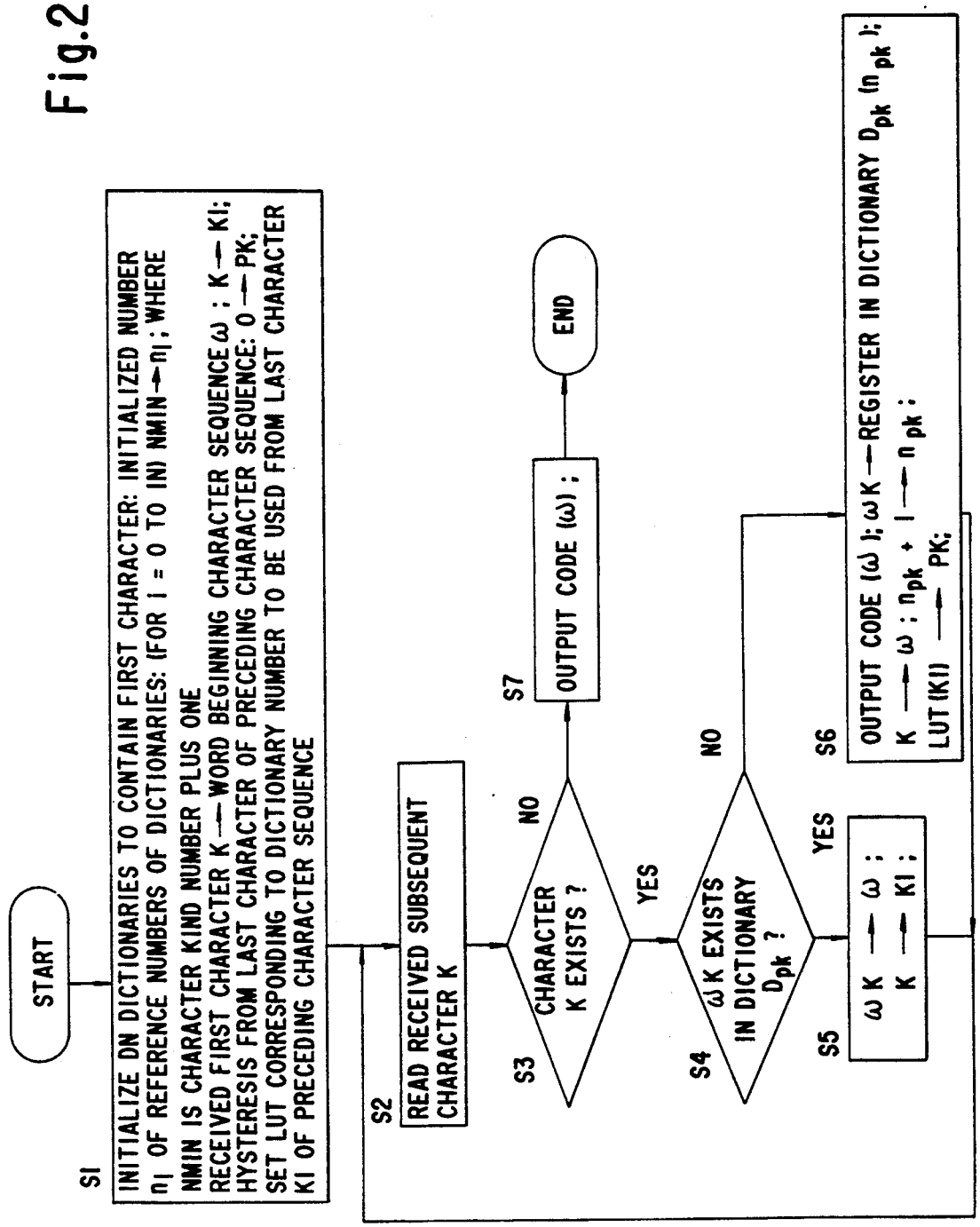
FIG. 26 is an illustration showing algorithm of coding.

The algorithm, for coding will be discussed with reference to the flowchart of FIG. 26.

First, in S1, the following process is performed.

(i) For each of N dictionaries Di, here i=1, ... N, selected by the final character of the immediately preceding string, all character kinds of single character strings are registered as initial values. For all 256 kinds of characters, the number of the dictionary is relatively small, i.e., 16.

(ii) The overall number of the reference number of each dictionary Di is managed by the total number $N_i$, and for $N_i$ at the initialization for N dictionaries, $$N_i = \text{character kinds} + 1,$$

is set.

(iii) The history, namely, the upper 4 bits of the last character code of the immediately preceding sting from the immediately preceding string is taken as PK. Then, as the initial value of PK, PK=0 is set.

(iv) Taking the beginning character as input K, this input K is converted into the prefix string ω.

(v) Based on the last character of the immediately preceding string, the look-up table for correlating the historical condition is set. Here, since there is no immediately preceding string at the initial stage, the K1 indicative of the last character of the immediately preceding string is set to K1=0. The look-up table is set in such a manner that when the K1=0, the index obtained in terms is PK=0.

After completing the process of S1 as set forth above, coding is performed through the manner shown in steps S4 to S7. The processes in steps S4 and S7 are the same as that in the prior art.

However, instead of using a sole dictionary as that taken in prior art LZW coding, initially in S1 and subsequently in S6 the specific dictionary $D_{PK}$ is designated among a plurality of dictionaries by the historical LUT(K1)=PK obtained by making reference to the look-up table. By performing a comparison with the registered strings in the selected dictionary $D_{PK}$, a search for the maximum coincidence is performed. For the string coincident with the maximum coincidence, the next character is added to form a string ωK and then the string ωK is registered in the selected dictionary $D_{PK}$.

After registration for the dictionary $D_{PK}$, a counter $N_{PK}$ managing the reference number of the dictionary $D_{PK}$ is incremented by one as $N_{PK}=N_{PK}+1$. On the other hand, for selecting the dictionary for the next string, the historical condition PK is derived utilizing the look-up table K1 in terms of the final character K1.

Figure 27B:
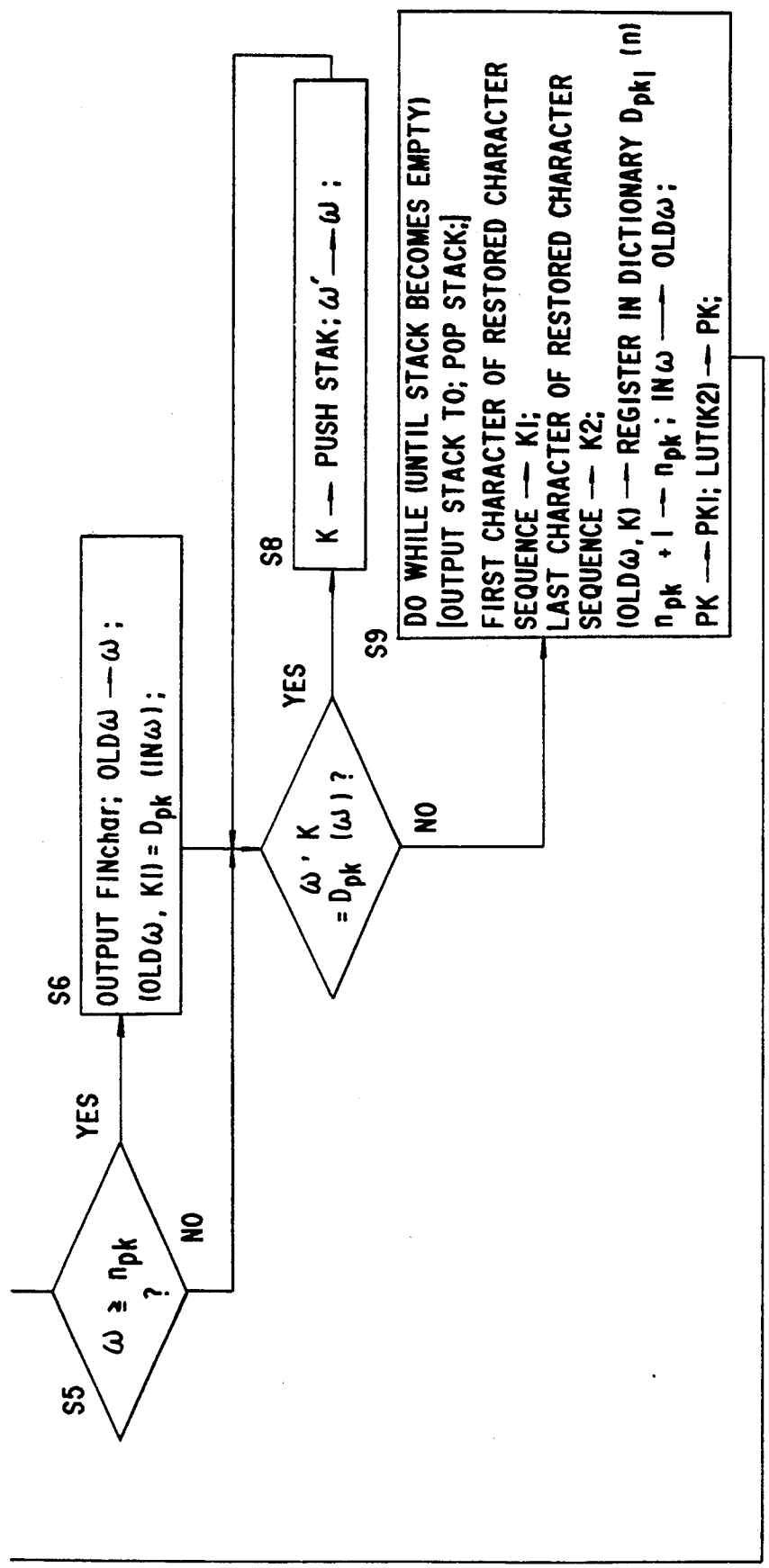

Algorithm for decoding will be discussed with reference to the flowchart of FIG. 27.

Decoding is a reverse operation to the coding process. At first, the initializing of the dictionary in S1(A) is the same as that in the coding process. The processes in S1(B) to S9 are the same as that in the prior art. However, after decoding the reference number ω from the input code S4, the dictionary $D_{PK}$ is selected using the historical condition PK derived from the final character of the immediately preceding string, and from the selected dictionary $D_{PK}$, the string corresponding to the reference number ω is obtained.

Registration of a new string for the dictionary is essentially the same as that for LZW coding. However, the registration is delayed for one cycle. Namely, in the case of coding, after coding the string in question, the string ω with one additional character, namely, the string in question plus one character, is registered in the dictionary. However, in decoding, when adding one character to the string in question, in order to make registration with the beginning character of the next string the registration is performed after completion of decompression for the next string.

Practically, as shown in S9, the combination of the reference number OLDω of the immediately preceding string and the beginning character K1 of the decompressed string is registered in the dictionary $D_{PK1}$ selected according to the historical condition PK1 obtained from the last character of the immediately preceding string. Therefore, in order to prepare for the extension of the decompressed string for the next registration, the current historical condition PK is shifted to PK1, and the new historical condition is obtained from the last character K2 of the decompressed string.

It should be specially noted that, although the foregoing discussion is given for the example of establishing 16 dictionaries for all 256 kinds of characters, the number of dictionaries should not be specified since the given number can be appropriately selected to the number smaller than the number of all kinds of characters.

Also, the number of kinds of characters can be appropriately selected as necessary.

Figure 28:
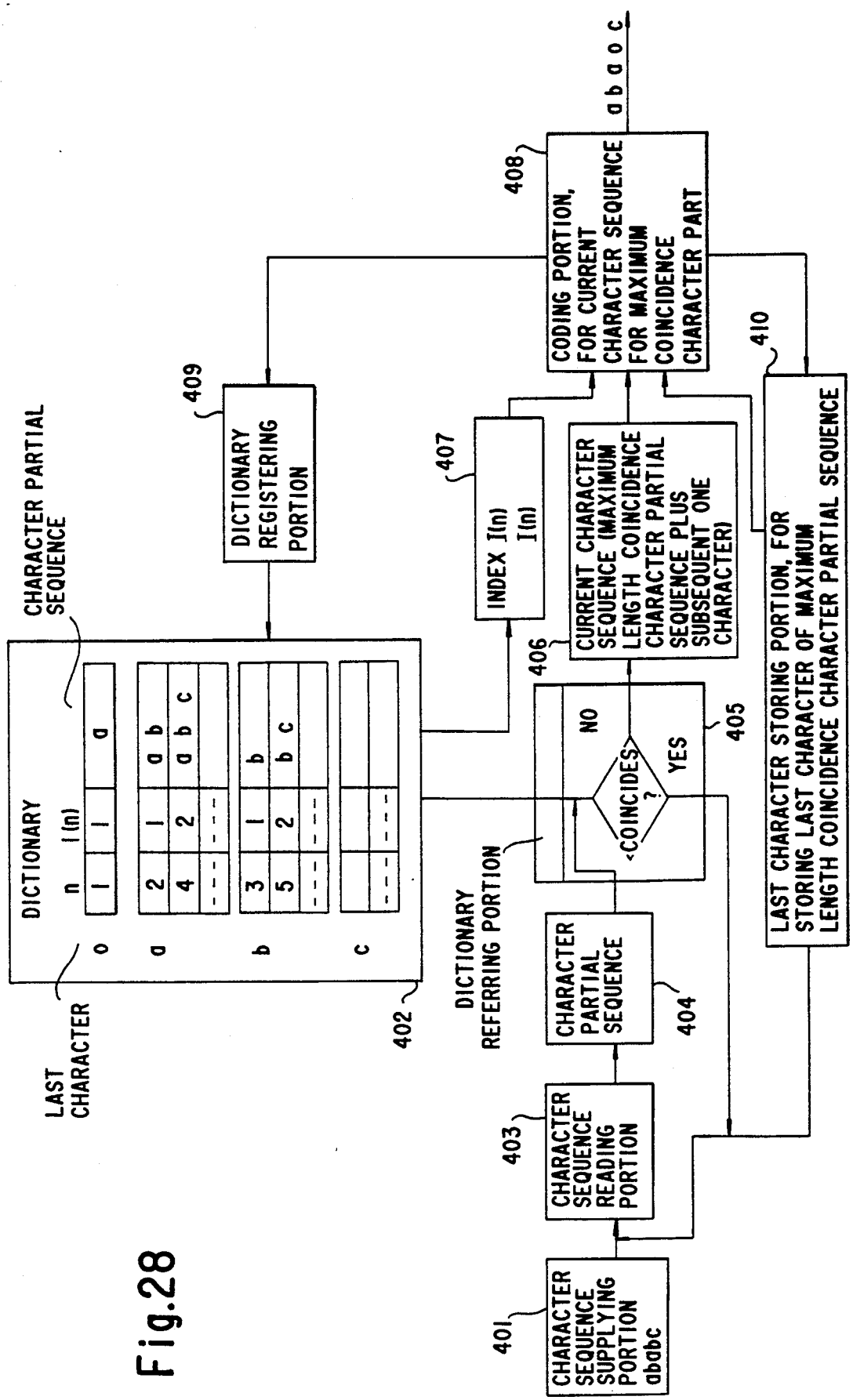
FIG. 28 is an illustration of an exemplary embodiment of the system for implementing the method of data compression and decompression according to a still further aspect of the invention.

A system for data compression and decompression according to a further aspect of the invention is illustrated in FIG. 28.

FIG. 28 shows an example, wherein when the character sequence is composed of only 3 characters, a, b, c, the dictionary is generated with respect to respective final characters of the immediately preceding strings, and the dictionary thus generated has no registered initial value.

In FIG. 28, Reference number 401 denotes a character sequence, supply portion, and, 402 denotes dictionaries registering indexes "I(n)" of the registered strings for every tree having the roots of the last characters. For example, for the tree having the root (a) the index for the strings ab, abc are respective 0, 1 and so forth. Reference number 403 denotes a character sequence reading portion for reading the input character sequence one by one. Reference number 404 denotes the current string in question. Reference number 405 denotes a dictionary referring portion for comparing the current string with the dictionary for reading out the string of the maximum coincidence of the current string with respect to the registered strings. Reference number 408 denotes a coding portion which performs coding on the basis of the registered index for the maximum coincidence of the string, and for the newly appearing string including the maximum coincidence and additional next character, the index is given with respect to the last character of the immediately preceding string. Reference number 409 denotes a dictionary registering portion for registering the current string to the dictionary, and reference number 410 is the last character storing portion for storing the last character of the maximum coincidence. Reference number 411 denoted an example of a tree of a dictionary taking the last character as root.

The operation of the system of FIG. 28 will be practically discussed by taking the example of coding the input character sequence of "ababcb . . . ".

Figure 29:
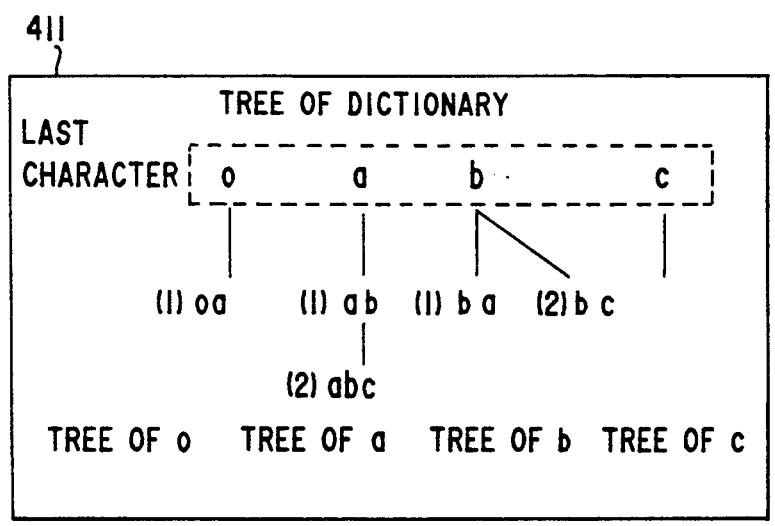
FIG. 29 is an illustration showing a tree of dictionaries taking the last character of character sequences as roots.

The tree of the dictionaries having roots of the last character of the immediately preceding string, must distinctly output for the (a) of the tree having the root (a) and the (a) of the tree having the root (b) with respect to the strings having the last character (a) following (a) and the string having the last character (b) following (a), when the string (a) is to be output, as shown in FIG. 29.

In order to output a single character associated with respective roots, one of two methods has to be taken, in which (i) by preliminarily generating the initial values for coding and decoding with the characters forming the root of the tree and one additional character, such as "aa, ab, ac, ba . . . " to distinctly output the (a) following (a) and (b) following (a) and so forth, or (ii) when a single character appears to be associated with one of the roots of the tree, the single character is output as the raw data.

Here, the description is made for the case where, with taking the last character of the immediately preceding string as a root of a tree of the dictionary, and without registering the initial value associated with the root, the signal character directly associated with the root of the tree is output as the raw data.

(First) The character read portion 403 reads the first character (a) and forms it as string 404. The dictionary referring portion 405 makes the reference to the dictionary to confirm that the (a) has not been registered.

The coding portion 408 sets the index 0 as the code designating the raw data.

The dictionary registering portion 409 registers (a) for the dictionary of the tree of the last character 0 of the immediately preceding string at a registration position of "n=1."

At the same time, the index 0 and the character (a) are output.

Then, (a) is stored as the last character of the immediately preceding string.

(Second) The second character b is read.

Then, with respect to the string ab composed of the last character a of the immediately preceding string and the input character b, reference is made to the dictionary. Since ab is not yet registered, the string "ab" is then registered in the register position "2" of the dictionary having the tree of the root (a), as the first registered sequence.

At this time, since the currently input (b) is the character appearing on the tree having the root (a), then the index 0 and the (b) are output as raw data. Then, (b) is stored as the last character of the immediately preceding string.

(Third) The third character (a) is then input.

Then, the reference is made for the string "ba" which is composed of the last character (b) of the immediately preceding string and the currently read out (a), on the dictionary.

Since (ba) does not exist, the string "ba" is then registered in the position of the dictionary at "n=3" as the beginning character of the dictionary of the tree having the root (b) of the immediately preceding string.

The final character (a) of the immediately preceding string is stored output as the last character of the immediately preceding string.

(Fourth) The fourth character (b) is read.

Then, with the last character (a) of the immediately preceding character and the read out character (b), reference is made for the dictionary for the string "ab". Since the "ab" has already been registered in the register position "3", the next character (c) is read.

Since the string "abc" is not yet registered in the dictionary, the coding portion 408 performs coding for the maximum coincidence "ab" by the index 1 indicative of the fourth character b of the "ab" in the tree having the root (a). At the same time, for the register position "4" of the dictionary, the newly appearing string "abc" is registered as the second string of the tree having the root (a).

The last character (b) of the output maximum coincidence character is stored as the last character of the immediately preceding string.

(Fifth) The fifth character (c) is read.

With the stored last character (c) and the read (b), a string (bc) is established, since (bc) has not yet been registered, the string (bc) is registered as the beginning string for the dictionary of the tree having the root (b) in the register position "5", namely, "index 5".

Then, (c) is the character directly connected to the root of the tree of the dictionary of the root (b), the index 0 and the character (c) are output as the raw data.

Subsequently, by proceeding the similar processes, output code "0a0b0a10c ..." is obtained.

Figure 30:
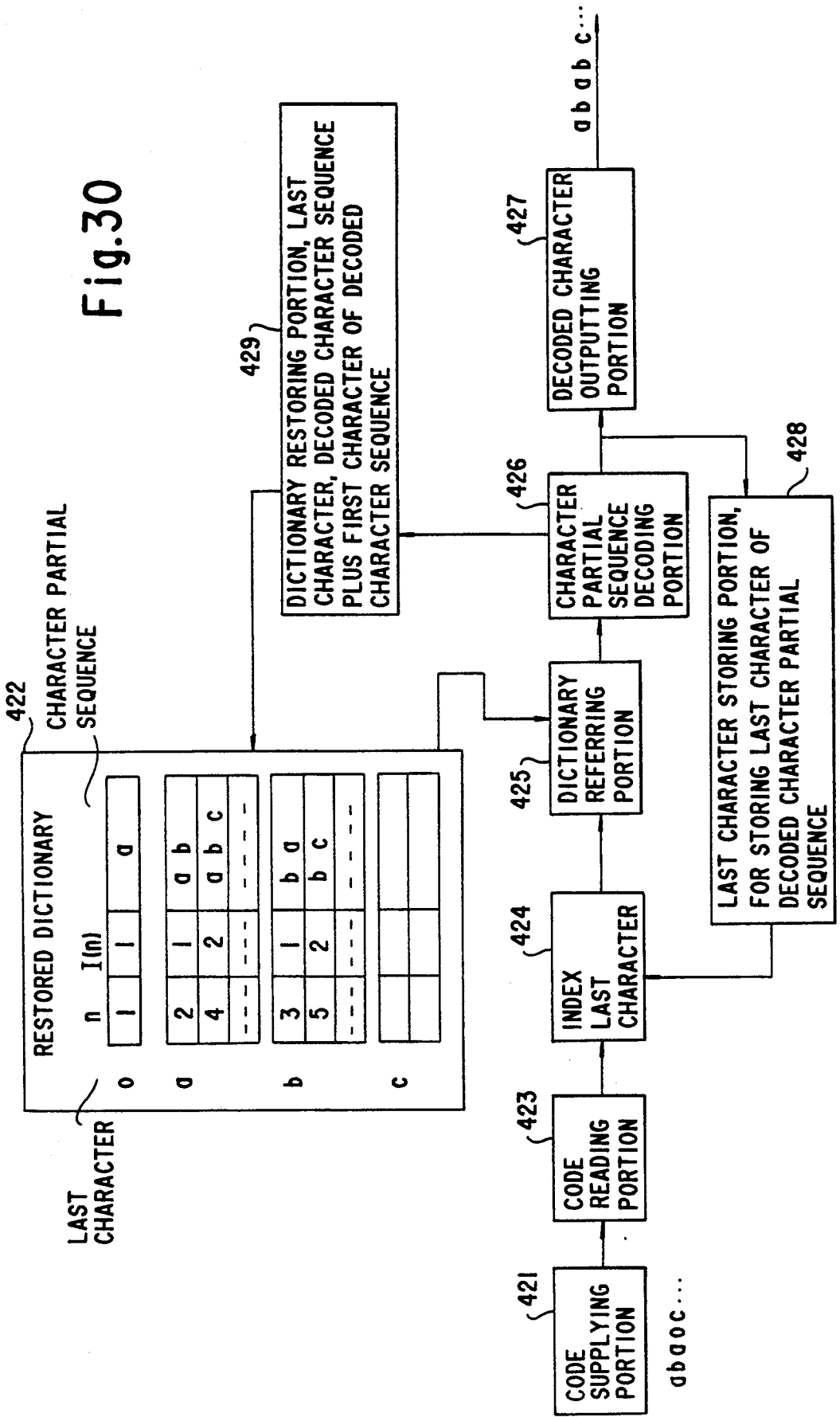
FIG. 30 is an illustration showing the architecture for performing a decoding of a data compression code into a character sequence.

The construction for performing decoding for the data compression code of the string in the system of FIG. 28 is illustrated in FIG. 30.

In the construction of FIG. 30, 421 denotes a received code. Reference number 422 denotes the dictionary restored from the input code. Reference number 423 is a reading out means. Reference number 424 is an index and the last character of the decompressed immediately preceding the string indicated by the input code. Reference number 425 denotes the dictionary referring portion. Reference number 426 denotes the string decoding portion for decoding the string from the registered string in the dictionary corresponding to the index and the last character of the immediately preceding character. Reference number 427 denotes a decoded character outputting section for outputting the decompressed character. Reference number 428 denotes the decompressed character storing portion for the last character of the decompressed string. Reference number 429 denotes a dictionary decompressing portion for registering the string composed of the decompressed string and the beginning character of the subsequently decompressed character in the tree of the last character of the immediately preceding string with the index.

An example of the decoding operation for the coded code "0a0b0a10 ..." will be described below.

(First) The input code read portion 423 reads out the input code (a). Since the read code is raw data, the string decoding portion 426 decodes the character (a) and output. Then, the character (a) is registered in the register position "1" of the decompressed dictionary 422 as the tree of the last character 0 of the immediately preceding string. At the same time, the last character (a) of the decoded string is stored.

(Second) Similarly, the next code (1b) is read, since this code is also the live data, the character (b) is decoded and output. Also. The string (ab) composed of the stored character (a) and the currently read character (b), is registered at the register position "2" of the dictionary having (a) as the root. Further, the last character (b) of the decoded string is stored.

(Third) Next code (a) is read. The string (a) is decompressed. The string (ba) composed of the stored last character (b) and the currently read (a), is registered to the register position "3" of the dictionary of the tree having (b) as the root, with the index "1". Then, the decompressed (a) is stored.

(Fourth) The fourth code 1 is read. Now, since the input code of the last character (a) of the immediately preceding character is 1, the dictionary referring portion 425 reads the string (ab) with reference to the dictionary. Then, the string decoding portion 426 decodes the string "ab". Further, based on the decoded string and the final character (a) of the immediately preceding last string, the decoded character outputting portion 427 outputs the character (b). The last character storing portion 428 stores the last character (b) of the decoded string.

(Fifth) The fifth code (c) is read.

Since it is the raw data, the character (c) is decoded. Then, the string abc composed of the string ab decoded in (Fourth) step and the currently decode character (c), is registered in the register position "4" of the dictionary of the tree having (a) as the root, with index "2" and thus restores the dictionary.

In the above description, discussion is given for the process for generating the tree of the dictionary for every last character of the immediately preceding string, the invention should not be limited to the specific process and is possible to aggregate the last characters depending upon their kinds and generate the tree of the dictionary for respective groups for registering the subsequent strings.

Figure 31:
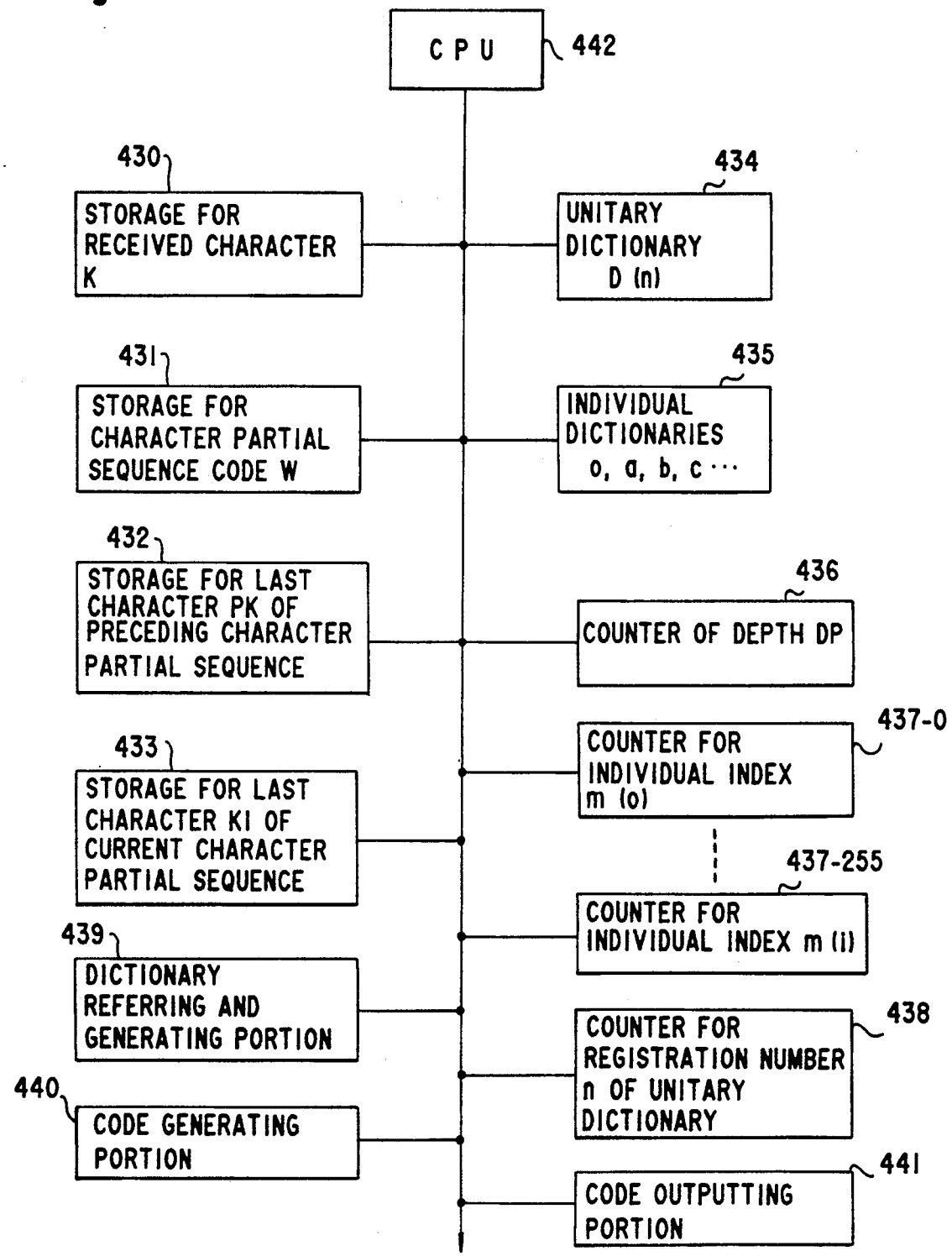
FIG. 31 is an illustration showing an example of a device for coding.

An example of the coding device to be employed in the system of FIG. 28 is illustrated in FIG. 31.

In the device of FIG. 31, the dictionary is generated separately for a unitary dictionary for registering the strings and an individual dictionary for registering the indexes associating the sting to the register position in the unitary dictionary with respect to the last character of the immediately preceding string.

In the device of FIG. 31, reference number 430 denotes a storage for storing the received character sequence K for coding the input character sequence. Reference number 431 denotes a storage for storing sting code ω. Reference number 432 is a storage for storing the last character PK of the immediately preceding string. Reference number 433 denotes a storage for storing the last character of the current string to be coded. Reference number 434 denotes the unitary dictionary D(n) comprising a memory. Reference number 435 are individual dictionaries comprising a memory and formed with respect to each of the 256 characters, such as 0, a, b, c, ... Reference number 436 denotes a counter for measuring depth of registration hierarchy of strings in the tree of the dictionary. Reference number 437-1 to 437-255 are counters for respective index m(0) to m(255) of the individual dictionary 0 to 255. Reference number 438 is a counter for register number n of the unitary dictionary. Reference number 439 is a dictionary referring and generating means for making reference to the dictionary and generating the dictionary. Reference number 440 denotes a code generating means for coding the read codes. Reference number 441 denotes a code outputting means for outputting the generated codes of the strings. Reference number 442 denotes CPU for performing and controlling process of data coding according to the programs.

Figure 32B:
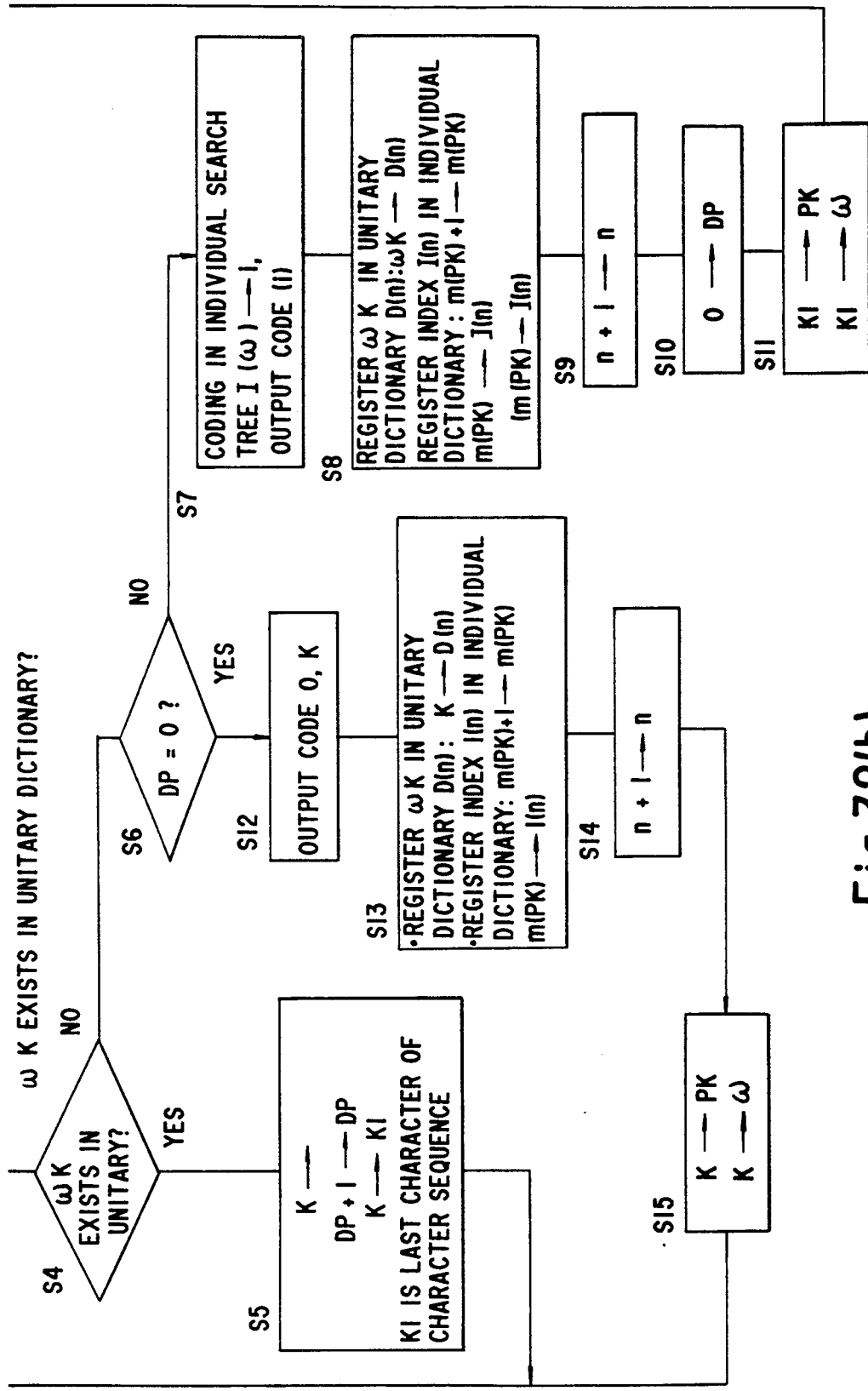

The processes of operation for coding in the device of FIG. 31 is illustrated in FIG. 32.

Examples of the unitary dictionary and the individual direction when the character sequence "ababcbaba ..." are illustrated in FIGS. 33 and 34.

Figure 35:
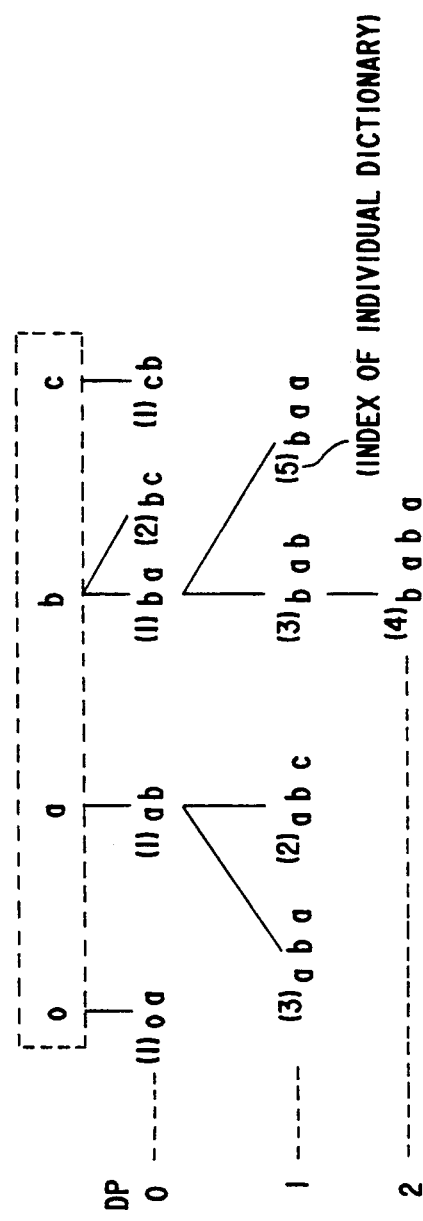
FIG. 35 is an illustration of a tree of individual dictionaries.

An example of the tree of the individual dictionary when the character sequence is coded, is illustrated in FIG. 35.

In the example of FIG. 35, when the character which is directly connected to the root of the tree of the last character of the immediately preceding string, appears first, the character is taken as raw data and the single character is fed.

Figure 36:
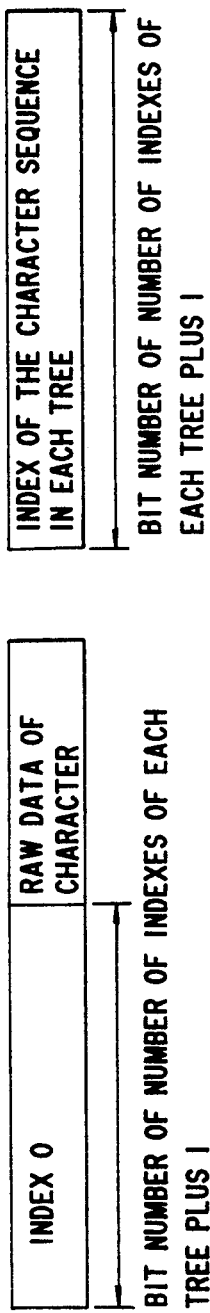
FIG. 36 is an illustration showing a code word.

An example of the code word is shown in FIG. 36. Mode 1 shows the case when the character directly connected to the root of the tree of each individual dictionary newly appears.

In mode 1, the combination of the index 0, namely designating the raw data, and the raw data of the character is fed as the code word.

When the index of the character or string other than 0 appears, the index in each tree is fed as the code word, as shown in FIG. 36.

The flowchart of FIG. 32 will be discussed below.

An initial condition setting step S1 shows the case when 256 individual dictionaries are provided. However, in order to simplify the disclosure, coding of the character sequence, which the character sequence "ababc . . . " constituted by only characters a, b, c will be considered.

At first, initialization of the overall system takes place in S1.

As the initial condition, (Condition 1) the final character PK of the immediately preceding string is set to 0. (Condition 2) The initial values of the string code storage memory is set to 0 in this case. In the drawing, the initial value is set to 256. (Condition 3) The measuring counter for the depth DP of the tree of the dictionary is set to 0. (Condition 4) The beginning address representative of the beginning register position of the unitary dictionary is set at 4 in this case. In the drawing, the beginning address is set at 256. The number of indexes of the individual dictionaries are respectively set to 0. In the drawing, since the individual dictionaries are established for four characters, i.e. 0, a, b, c, the number m(0), m(a), m(b), m(c) of indexes registered for respective dictionaries are set to 0.

(First) At S2, the beginning character a of the input character sequence ababcbaba . . . is read out.

The judgement at S3 determines whether reading the character sequence is completed to terminate the process. After judgement in step S3, the process goes to S4.

Since the string (a) following the immediately preceding string 0 is not yet registered in the unitary dictionary, the process goes to S6.

At this time, since the depth DP is 0, process goes to S12.

Since the instant case meets the above-mentioned mode 1, in S12, 0a as the code word is output based on m(0)=0 and the raw data a.

Then, in S13, the currently input character (a), here since the initial value of $\omega$ is 0, the string is 0a, is registered in the unitary dictionary D(n=4). Also, for the individual dictionary 0 (PK=0), the index I(n=4) is set. Then, the registered index number m(0) of the individual dictionary 0 is incremented by 1, to register 1, namely there is no previously registered character in the tree of the individual dictionary 0.

Then, in S14, the register position n of the unitary dictionary is incremented by 1.

Thereafter, the final string PK is set with the currently read (a). The sting code $\omega$ is then set to the code of the read out character (a), namely 1 as set in the initial condition.

(Second) Next, the second character b is read.

Since $\omega K = 1b$ is not yet registered in the dictionary, the process is advanced to S6. Since DP=0, the process is further advanced to step (12).

Here, since the mode is mode 1 with m(a)=0 and the raw character b, 0b is output.

Thereafter, in S13, $\omega K = 1b$ is registered in the dictionary D(n=5). Further, from the individual dictionary a (PK=a), the index I(n=5) is registered. The individual dictionary (a) is then incremented to the register number m(a) by 1 and, thus, 1 is registered, namely, there was no registered character in the tree of the individual dictionary (a). In S14, n is incremented by 1. Then, the currently read (b) is set as the last character PK, and the input character code $\omega$ is set to code 2 which is set for (b) in the initial condition.

(Third) Next, the third character (a) is read.

Since $\omega K = 2b$ is not yet registered, the process is advanced to S6. Since DP=0, in S12, in the mode 1, the combination 0b of m(b)=0, namely there is not a string in the tree of the individual dictionary (b), and the raw data (b), is output.

Then, in S13, the $\omega K = 2b$ is registered in the unitary dictionary D(n=6). At the same time, the index I(n=6) is registered to the individual dictionary (b) (PK=b). Then, m(b) is incremented by 1 and 1 made registered, namely, there was no registered character in the tree of the individual dictionary b. Next, in S14, (m) is incremented by (a) and PK is set to (am) and $\omega = 1$ is set. Thereafter, the next character (b) is read.

(Fourth) Next, the fourth character (b) is read.

In the judgement in S4, with reference to the unitary dictionary, since $\omega K = 1b$ has already been registered as code n=5, the process is advanced to S5.

Then, $\omega$ is replaced with n=5 read from the unitary dictionary. Then, the depth DP of the hierarchy is incremented by 1 to make it DP=1, and the currently read out (b) is then stored in the final character storage memory K1.

(Fifth) Then, the fifth character (c) is read.

Next, in S4, judgement is made whether $\omega K = 5c$ is registered in the unitary dictionary.

Since $\omega K = 5c$ is not yet registered, the process is advanced to S6.

Here, since DP=1, the process is further advanced to S7.

In S7, reference is made to the individual dictionary corresponding to $\omega = 5$ (n=5). Then, the index I(n=5)=1 and (b) following the last character (a) of the immediately preceding string (a) is output as mode 2.

Then, in S8, $\omega K = 5b(abc)$ is registered to the register position n=7 of the unitary dictionary. At the same time, for the individual dictionary (a), m(PK) is incremented by 1 corresponding to n=7 and index I=2, here n=7 is registered. Namely, it represents the second string registered in the individual dictionary (a).

Then, the (n) is incremented by 1 and the depth DP is set to 0.

Further, PK is set to (b) which is stored in the final character storage memory K1. $\omega$ is set to the code 2 of K1. Then, in S4, the currently read fifth character (c) is again made K and judgement is made whether $\omega K = 2c$ is registered in the unitary dictionary.

Since 2c is not yet registered in the unitary dictionary, the process is advanced to S6. Since DP=0, the process goes to S12. The character (c) is made as the live data and the code word 0b is output in mode 1.

Then, in S13, $\omega K = 2c$ is registered to n=8 of the unitary dictionary. Since the current PK=b, n=8, incrementing m(b) by 1, I=1, namely n=8, representing the second string in the tree of (b), is registered.

Further, n is incremented by 1. PK is made to the currently read out (c). Then, $\omega = 3$ is set according to the value in the initial condition of (c). Then, the next character is read out.

Though the subsequent process in the same manner, "0a0b0a1 0c0b1 13 . . . " as output code of the input character sequence "ababcbabaa . . . ".

Next, decoding into the character sequence from the above-mentioned code will be discussed. The construction of the device for decoding is illustrated in FIG. 37.

In the device of FIG. 37, 471 denotes an input code storage memory. Reference number 472 denotes a memory (IN$\omega$) for storing restored code decompressed into the code of the string in the unitary dictionary from the input code which is supplied as a code word by the index of the individual dictionary. Reference number 473 denotes a memory (OLDω) for storing the decompressed immediately preceding string. Reference number 474 is a memory (PK) for storing the final character of the decompressed immediately preceding string. Reference number 475 is a final character storage memory (PK1) for storing final character of the preceding string which is the immediately ahead of the immediately preceding string. Reference number 476 is a first character storage memory (K1) for storing the first character of the decompressed string. Reference number 477 is the unitary dictionary D(n) which is decompressed from time to time through the decompressed strings of the input code. Reference number 478 is individual dictionaries q which are decompressed by the decompressed strings, name index of PK. Reference numbers 479-0 to 479-255 are index number counters for 255 individual dictionaries. Reference number 480 is a dictionary reference means for making reference to the individual code according to the input code. Reference number 481 denotes the string decoding means for decoding the strings through the unitary dictionary. Reference number 482 is a dictionary restoring means for decompressing the strings in a unitary dictionary and the corresponding individual dictionaries with the decompressed strings. 483 denotes CPU for progressing a decoding process according to the programs.

Figure 38A:
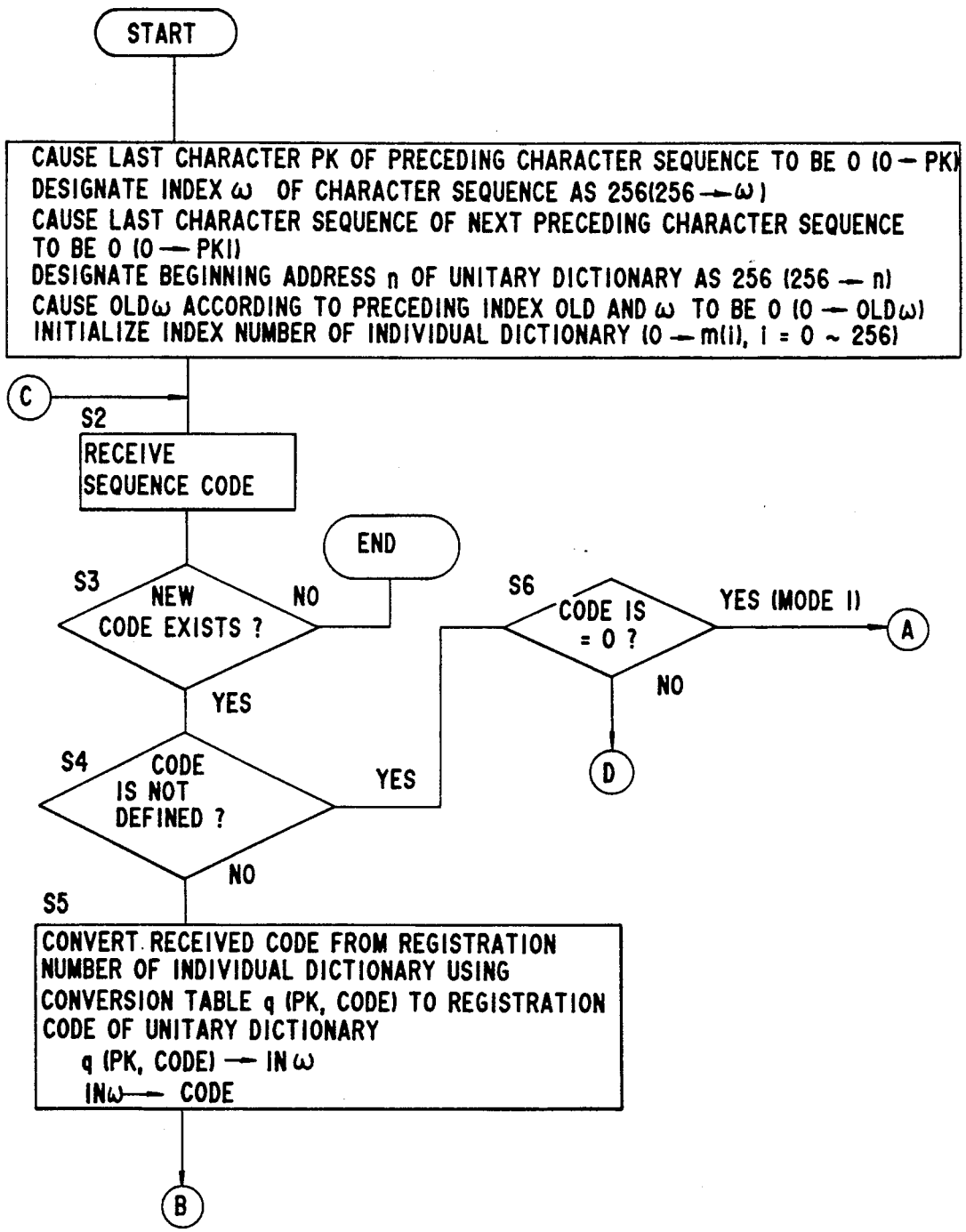
FIGS. 38(A), (B) and (C) are flowcharts showing a process of coding.

The process of coding is illustrated in FIGS. 38(A), (B) and (C). As shown in FIG. 38(A), judgement is made whether the input code is defined through initialization. If the input code is defined, reference is made to the individual dictionary to covert it into the code representative of the string in the unitary dictionary.

Figure 38B:
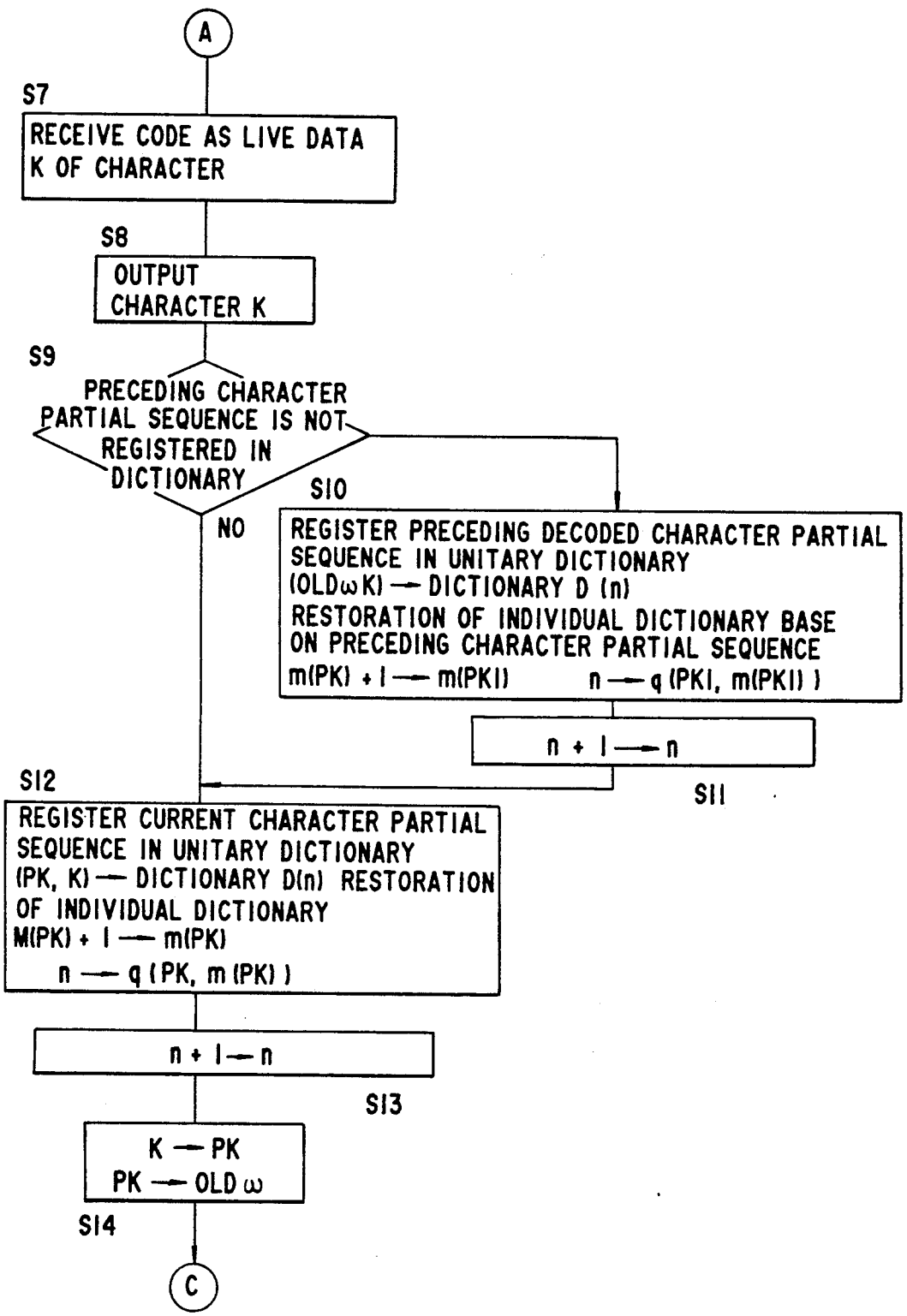

In the flowchart of FIG. 38(B), the code in the mode 1 is decoded.

Figure 38C:
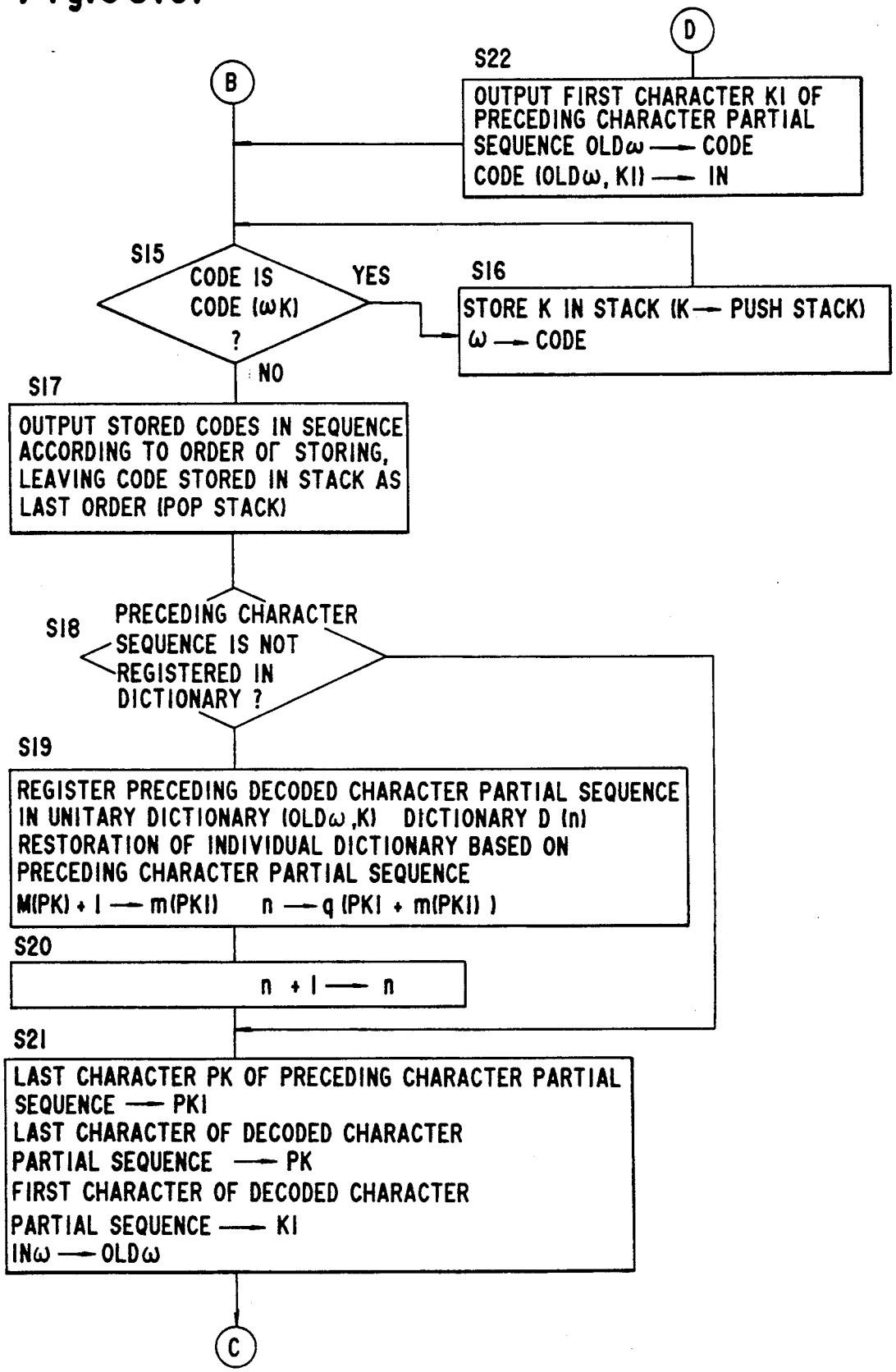

In the flowchart of FIG. 38(C), the string is decoded based on the registered code in the unitary dictionary.

As an example, in the case of the above-mentioned code "0a0b0a10c . . ." input as the, input code will be discussed herebelow.

At first, initialization is performed.

In the initial condition, there is shown the case where 256 individual dictionaries are provided and for 256 individual characters, the initial condition of 0 to 255 are given. Under the initial condition, PK=0, the initial value of ω is set at 256, PK1=0, the leading address of the unitary dictionary is n=256, OLDω=0, m(0) to m(255) of the individual dictionaries are set at 0.

In order to simplify the disclosure, consideration is given for the case of only three characters, i.e. a, b, c. For a, b, c, codes 1, 2 3 are given as initial conditions. Further, the initial value of ω is set to 0.

(First) In S2, the beginning input code is set to 0a.

Since the code is not defined in the judgement in S4, the process is advanced to S6.

In the judgement in S6, discrimination is made whether the code represents mode 1 which is directly connected to the root of the tree of the dictionary of the immediately preceding string, or the undefined code input of the exceptionally generated code through a LZW coding process.

At the present, since the input code is mode 1, the process is advanced to S7 in FIG. 38(B).

In S7, based on the receipt of input code 0a as a raw data K=a, character a is output.

Here, since there is no immediately preceding string, the process is advanced to S12. With the decompressed string (a) and PK=0, 0a is registered in n=4 of the unitary dictionary (D) to restore the unitary dictionary. Further, by increment m(0), with Pk=0, m(0)=1 and n=4, the individual dictionary 0 is restored.

Further, at S13, n is incremented. PK is set with the currently decompressed (a), Then, PK=0 is shifted to OLDω.

(Second) The second input code 0b is read out.

Even in this case, the code is mode 1, the process proceeds through S4 to S6 and subsequently to S7.

In the flowchart of FIG. 38(B), through the similar process to processing of 0a in the (First) step, the live data (b) is output. (ab) is registered in the register position n=5 of the unitary dictionary. Further, n=5 and index=1 are registered in the individual dictionary corresponding to the last character of the immediately preceding string (a), and thus the individual dictionary is restored.

(Third) The third input code 0a is input. The code 0a is similarly mode 1, the foregoing processes are repeated. Thus, the (a) is output as the restored code. (ba) is written in the unitary dictionary. n=6 and Index=1 is written in the individual dictionary b.

Then, m(b)=1, n=7, PK=a, OLDω=b are respectively set. Thereafter, the next code is read out.

(Fourth) The fourth code is 1.

Since the code 1 is defines, the process goes to S5 of FIG. 38(A).

Since the immediately preceding string is (a) and the input code is 1, reference is made to the restored individual dictionary and the corresponding register position of the unitary dictionary is checked.

As a result, the input code is converted into n=5, ωK=1b and written in INω. Then, process is advanced to S15 of FIG. 38(C).

FIG. 38(C) is a flowchart of a decoding process in LZW code.

S16 and S17 are the same as that in the prior art decoding process.

That is, in S16, the code 1b is stored in the stack in order of codes (b) and (a). In S17, by leaving (a), the upper (b) is output.

Since the immediately preceding string has already been registered in the dictionary, the process is advanced to S21, for two preceding string the last character storage memory, PK=a is written, the last character (b) of the decompressed string (ab) is written in PK, and the beginning character (a) of the decompressed string is written into K1.

At the same time, the decompressed code 1b (in INω) is written in OLDω, and the next code is read.

(Fifth) The fifth code 0c is read out.

Since this is the code of mode 1, the process goes to S7 of FIG. 38(B), and (c) is output at S8.

In this case, since the immediately preceding string is not yet registered, at S10, with 1b of OLDω and the currently input (c), string (abc) is registered at the position n=7 of the unitary dictionary. At the same time, m(a) is incremented by 1. Index=2 is written in the individual dictionary (a).

At S11, n incremented by 1. At S12, the current string, namely, the string (bc) at the time of reading (c) with the last character (b), is processed for registration. At the same time, the process is performed for make registration for the individual dictionary b.

Subsequently, by a similar process, all input codes are read and decoded.

It should be noted that S10 and S11 in the flowchart of FIG. 38(B) represent similar processes to that discussed with respect to processing for exception of LZW coding in the prior art.

Although in the above description, with respect to each of the individual characters connected to the roots of the trees of respective individual dictionaries, the raw data are output, the invention is not restricted to this specific process, and it is possible to form possible combinations of individual characters to be connected to the roots of the trees of respective individual characters at coding and decoding sides and to output for the above-mentioned individual character according to the generated code.

On the other hand, by taking the approach in which the code word to be output is always described by the "individual index ω of the string in question and the next single character K", and this "next single character" is used as a last character of the immediately preceding string to perform a coding for the next single character, the process of coding and decoding can be simplified.

The construction of the tree in the system of FIG. 28 and the method of coding of the string will be discussed with reference to FIG. 39.

As shown in FIG. 39, the code for the current string is given in relation to the dependency to the immediately preceding last character.

With respect to every final character of the immediately preceding strings, with the beginning character or its developed character, the tree is composed. Also, with respect to each tree, each string is given the number.

For example, with respect to the immediately preceding character (a), when single character (a) is connected, that (a) is taken as index 1 of the corresponding tree, when string (ab) is connected, index 7 is given, and when the single character (b) is connected, then index 2 is given. Also, in case that the immediately preceding string is (b), the single character (a) given the index of the tree of the immediately preceding string (b) is 1, "ab" is given the index 4. As can be appreciated, for each string, an index is given with respect to the tree having the immediately preceding string as a root.

With this, assuming that every character appears with uniform probability, the length of the index, namely the registration number for each string in the tree of the respective dictionary can be reduced as 1/256.

Normally, the size of each individual tree is one tenth of the overall size of all trees. Therefore, the codes for identifying the strings can be shortened to increase the compression ratio.

Figure 40:
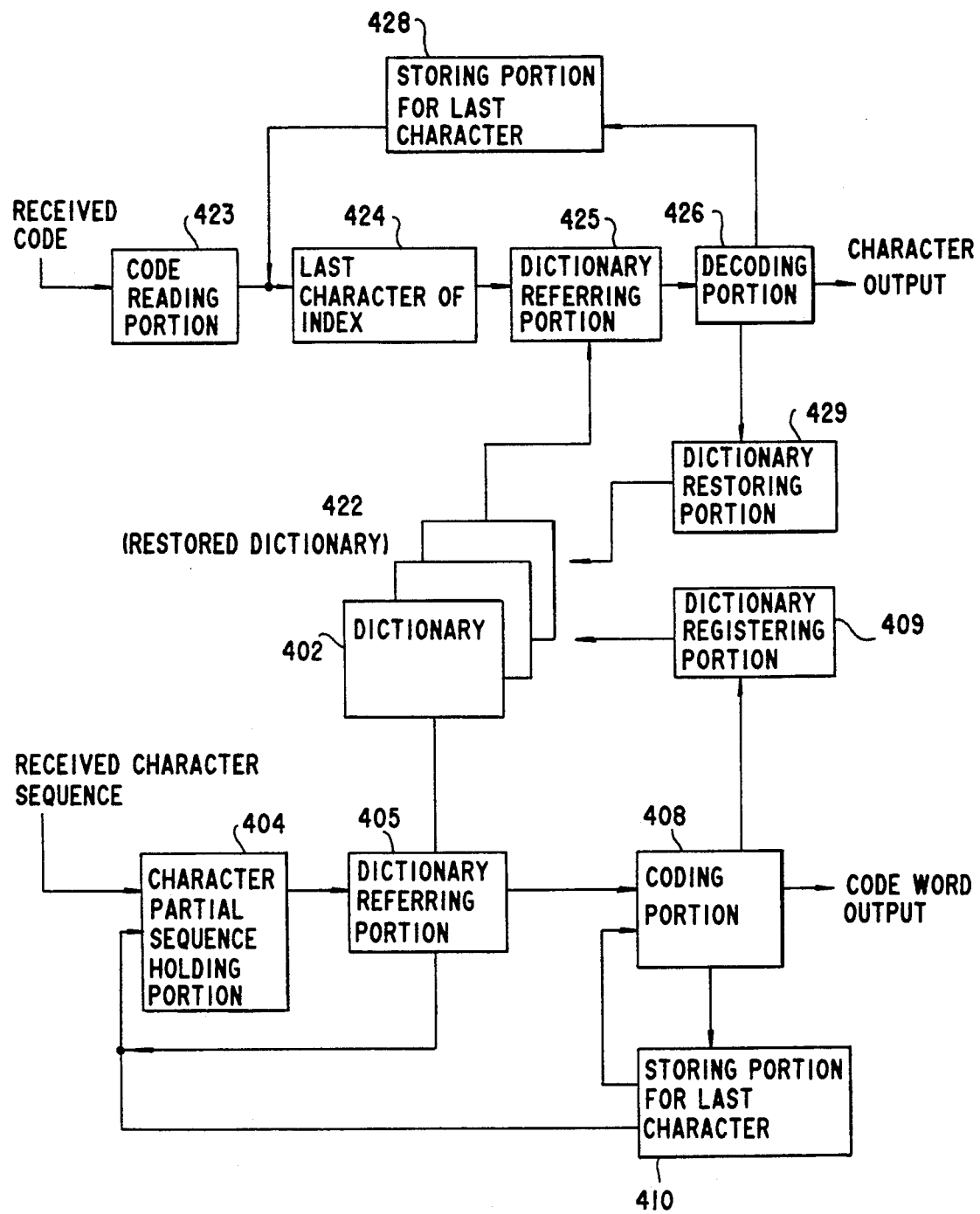
FIG. 40 is an illustration for describing an apparatus for data compression and restoration as an abstract.

As an abstract of the illustrations of the apparatus for data compression and decompression according to the invention, FIG. 40 is provided. In the apparatus of FIG. 40, there are provided a string holding section (404) for reading out the supplied character sequence one by one and holding the current string to be coded, a dictionary (402) for storing the string depending upon the final character of the immediately preceding string with respect to each of the final characters of the immediately preceding strings, a dictionary reference section (405) for reading out maximum coincidence to the current string among the strings registered in the dictionary in association with the final character of the immediately preceding string to the current string, a coding section (408) for coding the maximum coincidence string of the read out string, a dictionary registering section (409) for registering newly appearing strings composed of the maximum coincidence string and the next character to the dictionary with an index determined with respect to the final character of the immediately preceding string, a code reading out section (423) for reading out supplied codes one by one, a dictionary (422) restored by the input code, the index representative of the input code and final character (424) of the restored immediately preceding string, a dictionary reference section (425), a decoding section (426) for decoding the strings with the index and registered strings of the dictionary associated with the final character of the immediately preceding string, the final character storing section (428) for storing the final character of the decoded string, and a dictionary restoring section (429) for registering the strings composed of the restored string and the first character of the string to be decoded next depending upon the immediately preceding final character.

While the invention has been particularly shown and described in reference to preferred embodiments thereof, it will be understood by those skilled in the art that changes in form and details may be made therein without departing from the spirit and scope of the invention.

We claim:

1. A method for compressing and decompressing data in the incremental parsing manner, comprising the steps of:

coding by designating a reference number of the partial sequence having a maximum length coincidence from the coded partial sequences registered in a dictionary with regard to a received character sequence;

designating a new reference number for a partial sequence in which one character is added to the designated reference number as a code word, and registering the new reference number designated partial sequence in the dictionary; and decoding by searching partial sequences registered in the dictionary using a code word represented by the reference number of the partial sequence, decompressing the original partial sequence, designating a new reference number to a partial sequence which is obtained by adding the beginning character of the currently decompressed partial sequence to the previously processed code word, and registering the new reference number designated partial sequence in the dictionary, wherein an initialization of the dictionary is carried out by registering, as an initial value in the dictionary, a partial sequence having the highest frequency of occurrence among the partial sequences registered in the dictionary using the coding with regard to sample data, based on the determination that the partial sequence having the highest frequency of occurrence are already coded.

2. A method according to claim 1, wherein initial values of the dictionary obtained by coding the sample data are registered in the dictionary, and subsequently coding and decoding are carried out.

3. A method according to claim 1, wherein an initial value of the dictionary obtained by coding the sample data is registered fixed in a beginning portion of the dictionary where the replacing of writing is prohibited.

4. An apparatus for compressing and decompressing data, comprising:

dictionary initializing means having a sample data supply portion for supplying a sample data, a coding portion for coding the supplied sample data, a storage portion for storing the coded data in correspondence with the frequency of occurrence of character partial sequences, and a selection portion for selecting data having an occurrence frequency greater than a predetermined occurrence frequency from the stored data;

dictionary storage means, responsive to the output of the dictionary initializing means, for registering the data with a separation between an initial value registering portion and a data registering portion; and coding means and decoding means operably coupled to the dictionary storage means for coding and decoding the data, wherein the dictionary is initialized by registering, as an initial value in the dictionary, partial sequences having the highest frequency of occurrence among the partial sequences registered in the dictionary using the coding with regard to sample data based on the determination that the partial sequences having the highest frequency of occurrence are already coded.

5. A method for compressing and decompressing data in an incremental parsing manner comprising the steps of:

coding by designating the reference number of a partial sequence having the maximum length coincidence from the coded partial sequences registered in a dictionary with regard to a received character sequence, designating a new reference number to a partial sequence which is obtained by adding one character to a reference number obtained as a code word, and registering the new reference number designated partial sequence in the dictionary; and decoding by searching partial sequences registered in the dictionary using a code word represented by the reference number of the partial sequence, designating a new reference number to a partial sequence which is obtained by adding the beginning character of the currently restored partial sequence to the previously processed code word, and registering the new reference number designated partial sequence in the dictionary, wherein the step of coding includes the step of providing a reference dictionary from a plurality of reference dictionary units each constituted by groups having different beginning characters, wherein the step of coding further includes the steps of:

coding successive different partial sequences of the received character sequence by providing a code word by an indication representing a reference dictionary unit and an indication representing a register position of a partial sequence having the maximum length coincidence from the partial sequences registered in a reference dictionary, deriving transition probability between the beginning character of a partial sequence and the last character of a preceding partial sequence between the group of characters, and calculating transition probability between reference dictionaries, and if the transition probability of a partial sequence with regard to the preceding partial sequence is more than a predetermined value, representing a code word, as a variable length code word, by an indication having the length shorter than that of a code word assigned to a partial sequence having less transition probability.

6. A method according to claim 5, further comprising a step of dividing the characters which are possible to appear into a plurality of groups of characters and constituting a reference dictionary unit for each group of characters.

7. A method according to claim 5, further comprising a step of representing a code which represents a reference dictionary unit having the frequency of use more than a predetermined frequency by an indication having the length shorter than that of a code representing a reference dictionary unit having the frequency of use less than a predetermined frequency.

8. A method for compressing and decompressing data in the incremental parsing manner, comprising the steps of:

coding by designating the reference number of a partial sequence having the maximum length coincidence from the coded partial sequences registered in a dictionary with regard to a received character sequence, designating a new reference number to a partial sequence which is obtained by adding one character to a reference number obtained as a code word, and registering the new reference number designated partial sequence in the dictionary; and decoding by searching partial sequences registered in the dictionary using a code word represented by the reference number of the partial sequence, restoring the original partial sequence, designating a new reference number to a partial sequence which is obtained by adding the beginning character of the currently restored partial sequence to the previously processed code word, and registering the new reference number designated partial sequence in the dictionary, wherein the coding step includes the steps of providing a reference dictionary by a group of dictionaries including a number of dictionaries less than the number of entire kinds of characters to be processed, and for each dictionary, initially registering character sequences which occur at a higher frequency of occurrence and comprises one character of entire kinds of characters per character or a plurality of characters per character with designations of reference numbers, coding the received character sequences by designating a specific dictionary from the group of dictionaries according to search information representing the dependency relation to coded character sequences, if a received character sequence does not exist in the designated dictionary, registering a character sequence which is obtained by adding a subsequent character to the reference number of a coded character sequence with a designation of a new reference number.

9. A method according to claim 8, wherein a coding of a received character sequence is carried out by designating a specific dictionary from the group of dictionaries according to search information derived from a portion of the last character code of the immediately previously coded character sequence.

10. A method according to claim 9, wherein a coding of a received character sequence is carried out by designating a specific dictionary from the group of dictionaries according to search information represented by upper bits of the last character code of the immediately previously coded character sequence.

11. A method according to claim 8, wherein a coding of a received character sequence is carried out by designating a specific dictionary from the group of dictionaries according t search information derived by referring to a look up table based on the last character code of the immediately previously coded character sequence.

12. A method according to claim 11, wherein a coding of a received character sequence is carried out by designating a specific dictionary from the group of dictionaries according to search information formed by upper bits of the last character code of the immediately previously coded character sequence.

13. A method for compressing and decompressing data in the incremental parsing manner, comprising the steps of:
coding by designating the reference number of a partial sequence having the maximum length coincidence from the coded partial sequences registered in a dictionary with regard to a received character sequence, designating a new reference number to a partial sequence which is obtained by adding one character to a reference number obtained as a code word, and registering the new reference number designated partial sequence in the dictionary; and
decoding by searching partial sequences registered in the dictionary using a code word represented by the reference number of the partial sequence, restoring the original partial sequence, designating a new reference number to a partial sequence which is obtained by adding the beginning character of the currently restored partial sequence to the previously processed code word, and registering the new reference number designated partial sequence in the dictionary,
wherein the coding step includes the steps of providing a dictionary by a group of dictionaries including a number of dictionaries less than the number of the entire kinds of characters to be processed, and for each dictionary, initially registering character sequences which occur at a high frequency of occurrence and comprises one character of the kinds of entire characters per character or a plurality of characters containing entire kinds of characters per character with designations of reference numbers,
decoding the received codes by designating a specific dictionary from the group of dictionaries according to search information representing the dependency relationship to coded character sequences, and
registering a character sequence obtained by adding the beginning one character of currently decompressed character sequence to the reference number of a decompressed character sequence with a designation of reference number.

14. A method according to claim 13, wherein a decompression of a received code is carried out by designating a specific dictionary from the group of dictionaries according to search information derived from a portion of the last character code of the immediately previously decompressed character sequence.

15. A method according to claim 14, wherein a restoration of a received code is carried out by designating a specific dictionary from the group of dictionaries according to search information represented by upper bits of the last character code of the immediately previously decompressed character sequence.

16. A method according to claim 13, wherein a decoding of a received code is carried out by designating a specific dictionary from the group of dictionaries according to search information derived by referring to a look up table based on the last character code of the immediately previously decompressed character sequence.

17. A method according to claim 16, wherein a decoding of a received code is carried out by designating a specific dictionary from the group of dictionaries according to search information derived by referring to a look up table based on upper bits of the last character code of the immediately previously decompressed character sequence.

18. A method for compressing and decompressing data in the incremental parsing manner, comprising the steps of:
coding by designating the reference number of a partial sequence having the maximum length coincidence from the coded partial sequences registered in a dictionary with regard to a received character sequence, designating a new reference number to a partial sequence which is obtained by adding one character to a reference number obtained as a code word, and registering the new reference number designated partial sequence in the dictionary; and
decoding by searching partial sequences registered in the dictionary using a code word represented by the reference numeral of the partial sequence, decompressing the original partial sequence, designating a new reference number to a partial sequence which is obtained by adding the beginning character of the currently decompressed partial sequence to the previously processed code word, and registering the new reference number designated partial sequence in the dictionary,
wherein the coding step includes the steps of providing a registration dictionary by registering a subsequent partial sequence for each of the last characters of the first partial sequence of successive two partial sequences or each of the groups of partial sequences based on the last character,
designating a registration number of a partial sequence to be registered for each of the last characters or each of the groups of partial sequences based on the last character, and
providing a code word of partial sequence to be coded based on the designated registration number.

19. A method according to claim 18 wherein a restoration of a dictionary is carried out from data formed by the constituted code word for each of the last characters of a partial sequence precedent to a decoded partial sequence, and decoding of a received code to a character partial sequence is carried out from the last character of a partial sequence precedent to the decoded partial sequence and the currently received code by using the restored dictionary.

* * * * *